United States Patent
Hotta et al.

(10) Patent No.: US 6,939,750 B2
(45) Date of Patent: Sep. 6, 2005

(54) THIN FILM TRANSISTOR DEVICE AND METHOD OF MANUFACTURING THE SAME

(75) Inventors: Kazushige Hotta, Kawasaki (JP); Hiroyuki Yaegashi, Kawasaki (JP); Takuya Watanabe, Kawasaki (JP); Tamotsu Wada, Hatano (JP)

(73) Assignee: Fujitsu Display Technologies Corporation, Kawasaki (JP)

( * ) Notice: Subject to any disclaimer, the term of this patent is extended or adjusted under 35 U.S.C. 154(b) by 0 days.

(21) Appl. No.: 10/839,643

(22) Filed: May 5, 2004

(65) Prior Publication Data

US 2004/0232424 A1 Nov. 25, 2004

Related U.S. Application Data

(62) Division of application No. 10/325,603, filed on Dec. 19, 2002, now abandoned.

(30) Foreign Application Priority Data

Dec. 28, 2001 (JP) ........................................ 2001-401483

(51) Int. Cl.[7] ............................ H01L 29/04; H01L 21/84
(52) U.S. Cl. ............................ 438/149; 438/151; 257/72
(58) Field of Search ................................ 438/149, 151, 438/154; 257/72

(56) References Cited

U.S. PATENT DOCUMENTS

| | | | |
|---|---|---|---|
| 5,550,066 A | 8/1996 | Tang et al. | ............ 437/40 |
| 6,583,828 B1 | 6/2003 | Wada et al. | ............ 349/39 |
| 6,624,473 B1 | 9/2003 | Takehashi et al. | ............ 257/344 |
| 2002/0038998 A1 | 4/2002 | Fujita et al. | ............ 313/495 |
| 2002/0070385 A1 | 6/2002 | Yamagata | ............ 257/93 |
| 2003/0153110 A1 * | 8/2003 | Hotta et al. | ............ 438/30 |

FOREIGN PATENT DOCUMENTS

| | | | |
|---|---|---|---|
| JP | 2000-58848 | | 2/2000 |
| JP | 2003-188183 | | 7/2003 |
| JP | 2003-188385 | * | 7/2003 |

* cited by examiner

*Primary Examiner*—Nathan J. Flynn
*Assistant Examiner*—Ahmed N. Sefer
(74) *Attorney, Agent, or Firm*—Greer, Burns & Crain, Ltd.

(57) ABSTRACT

A polysilicon film is formed in a predetermined region on a glass substrate, and then a gate insulating film and a gate electrode, whose width is narrower than the gate insulating film, are formed thereon. Then, an interlayer insulating film and an ITO film are formed on an overall surface. Then, n-type source/drain regions having an LDD structure are formed by implanting the n-type impurity into the polysilicon film. Then, an n-type TFT forming region and a pixel-electrode forming region are covered with a resist film, and then p-type source/drain regions are formed by implanting the p-type impurity into the polysilicon film in a p-type TFT forming region. Then, the resist film is left only in the pixel-electrode forming region and the resist film is removed from other regions. A pixel electrode is formed by etching the ITO film while using the remaining resist film as a mask.

4 Claims, 32 Drawing Sheets

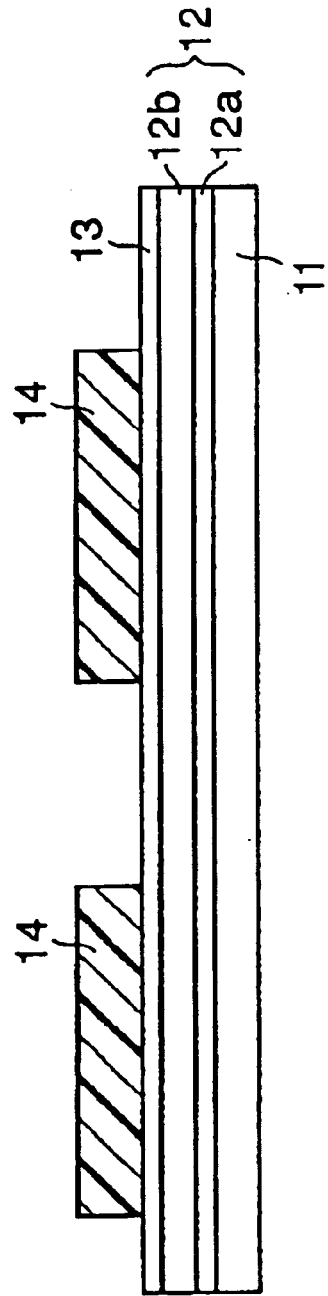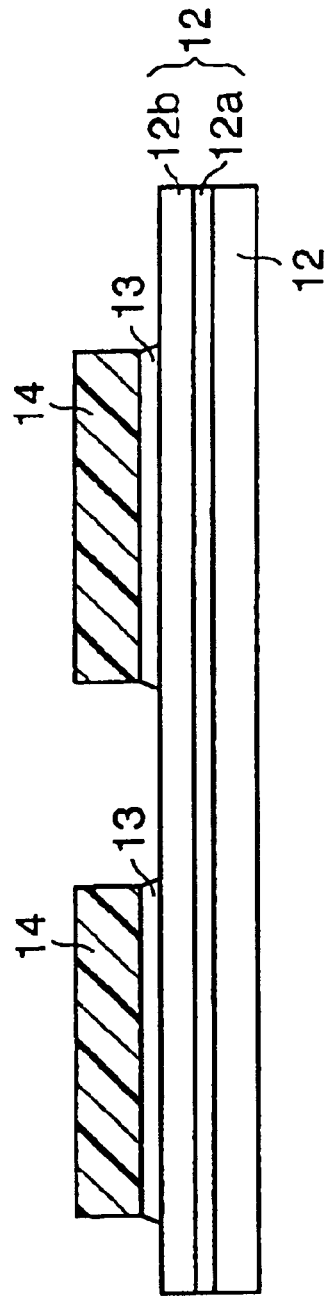

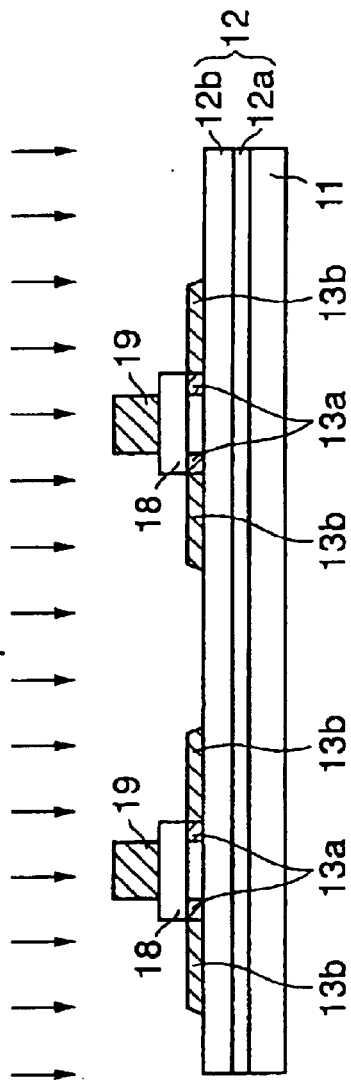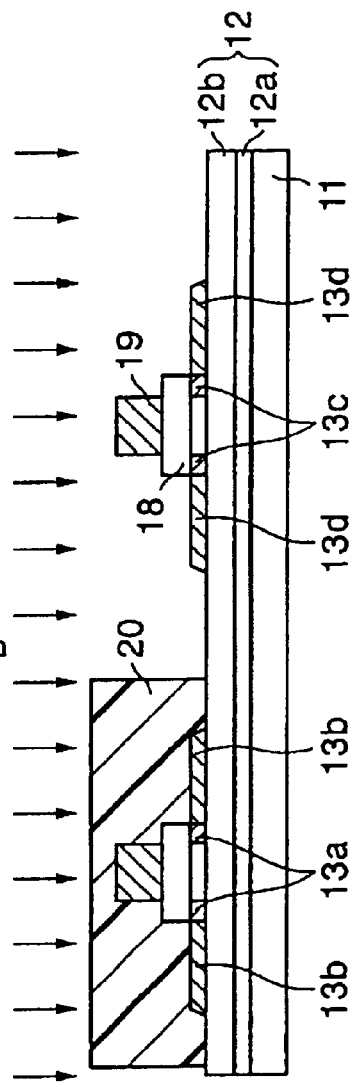

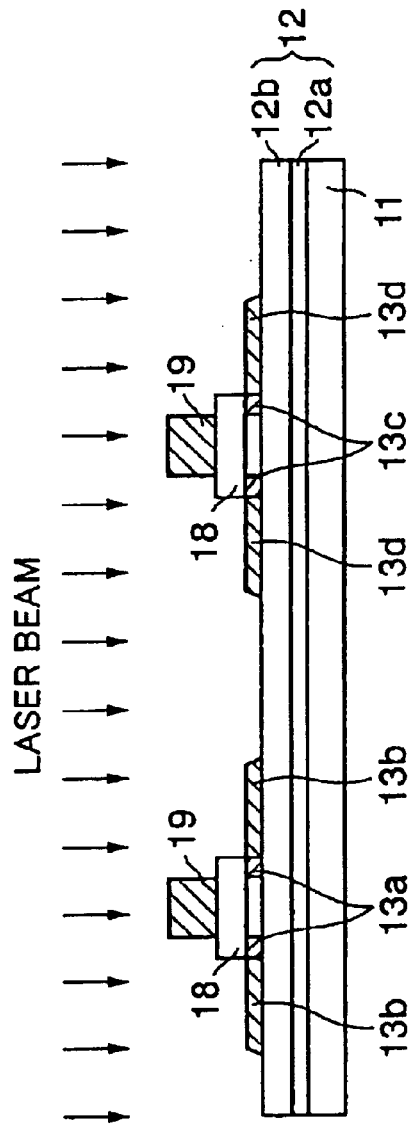
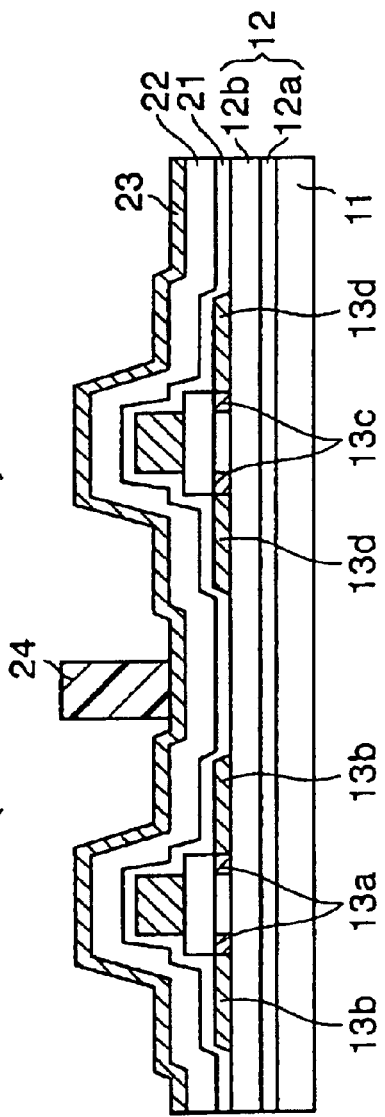

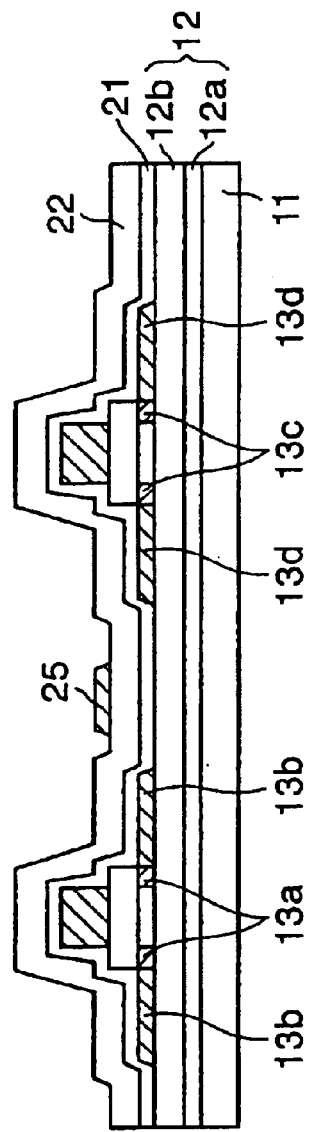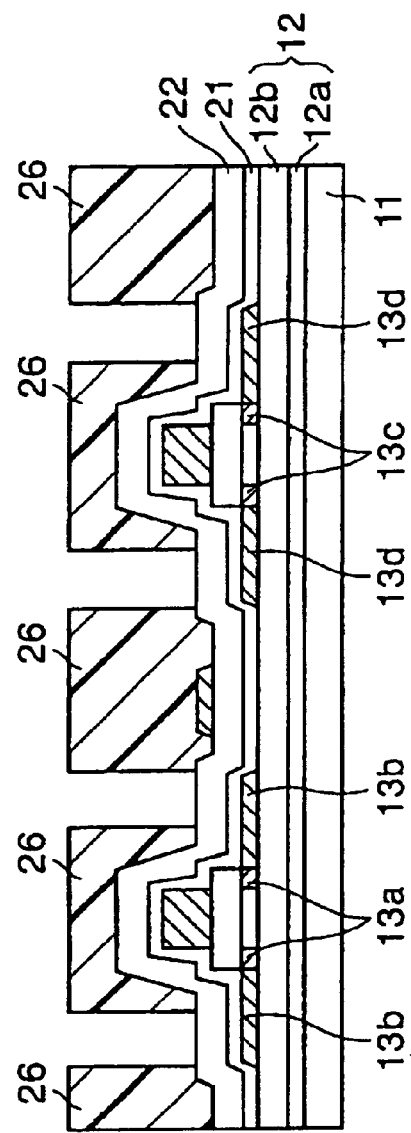

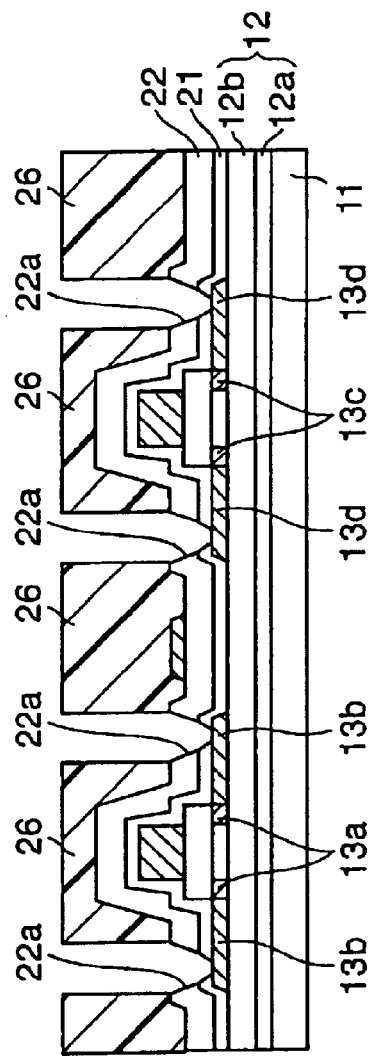
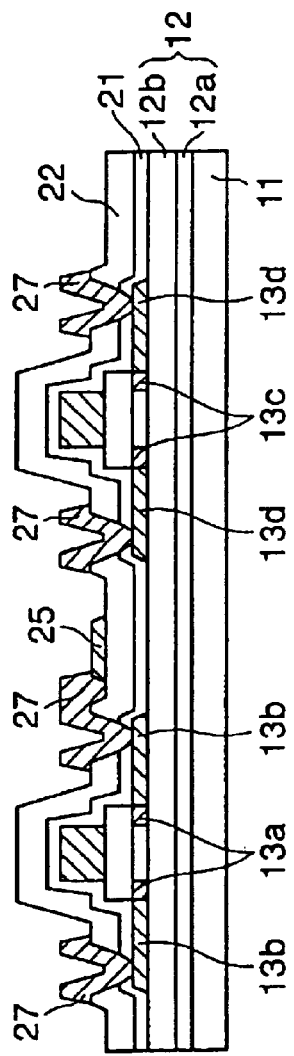

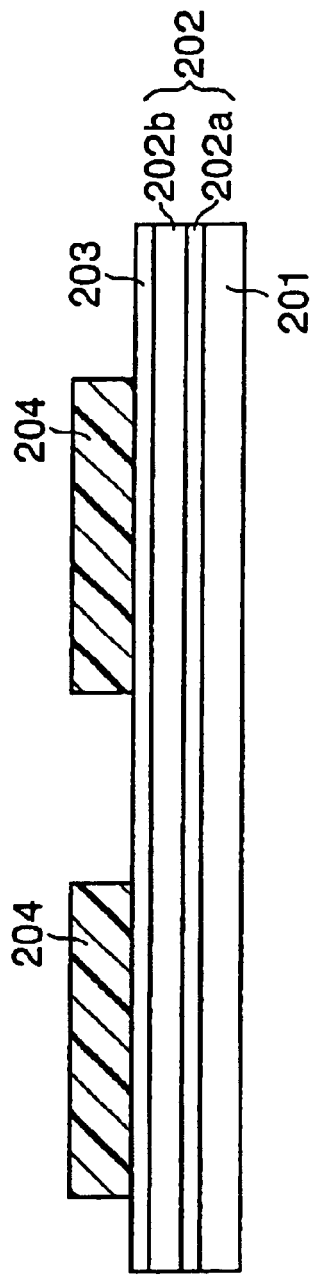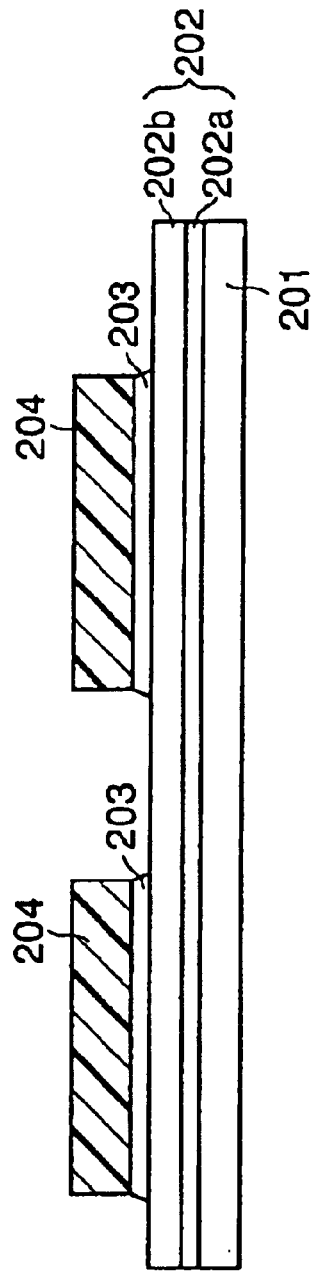

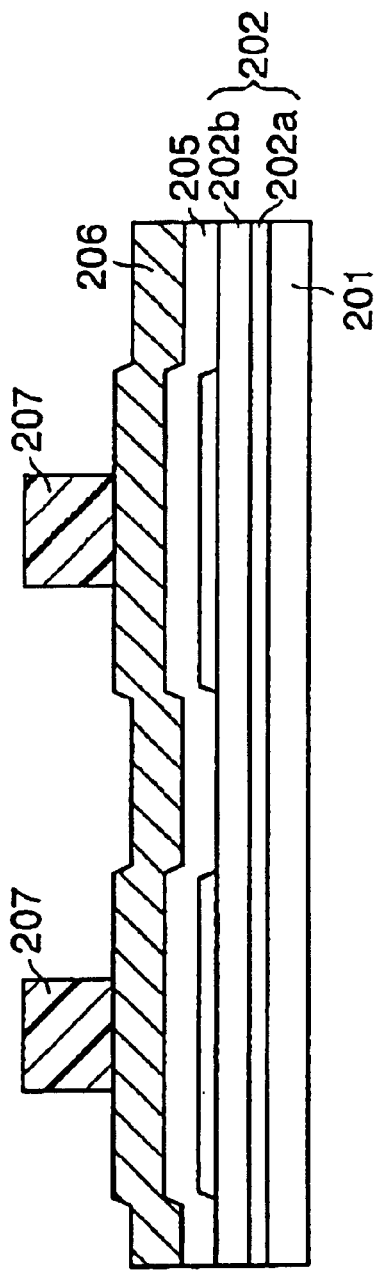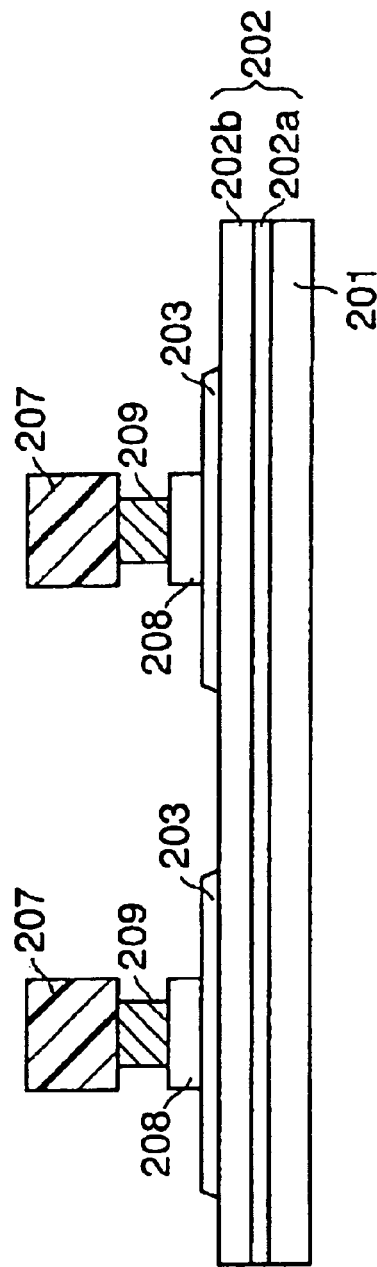

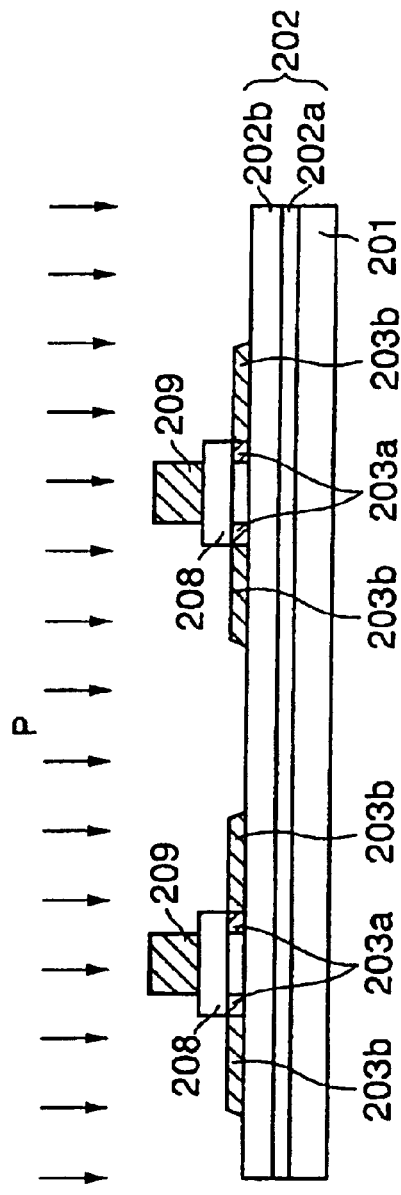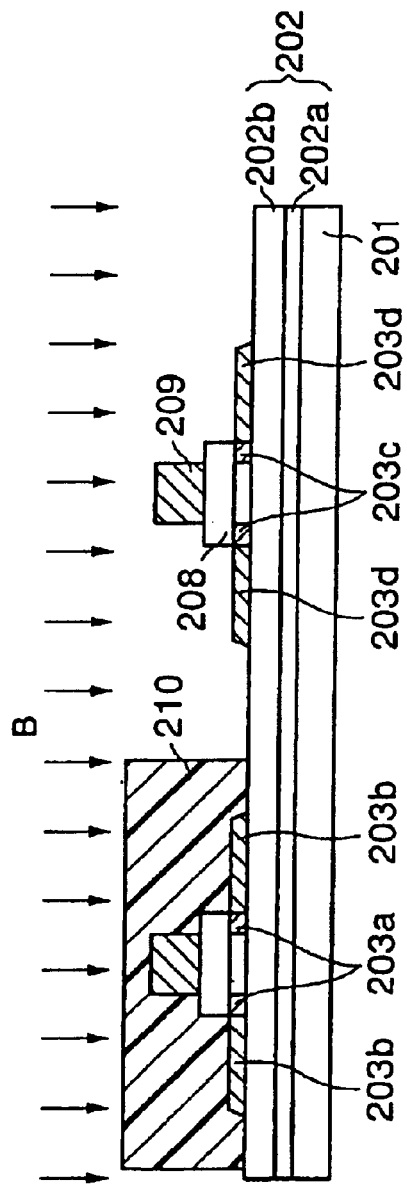

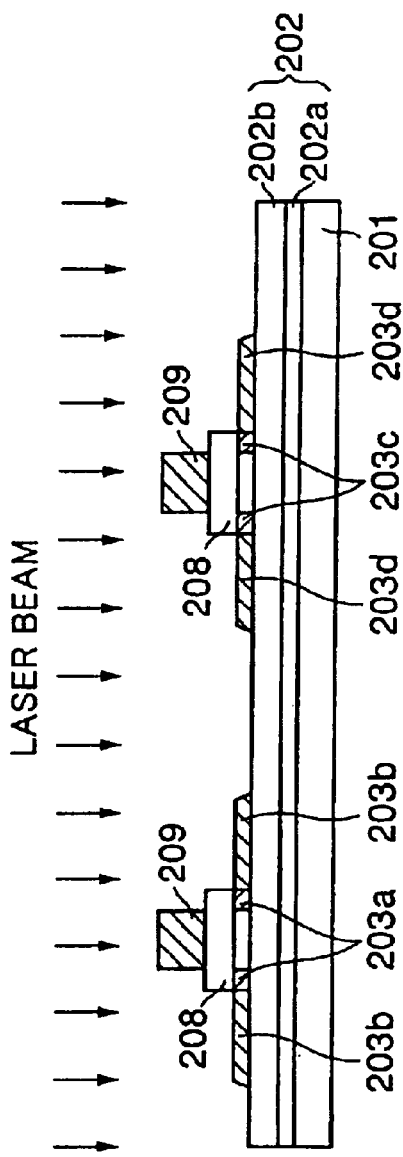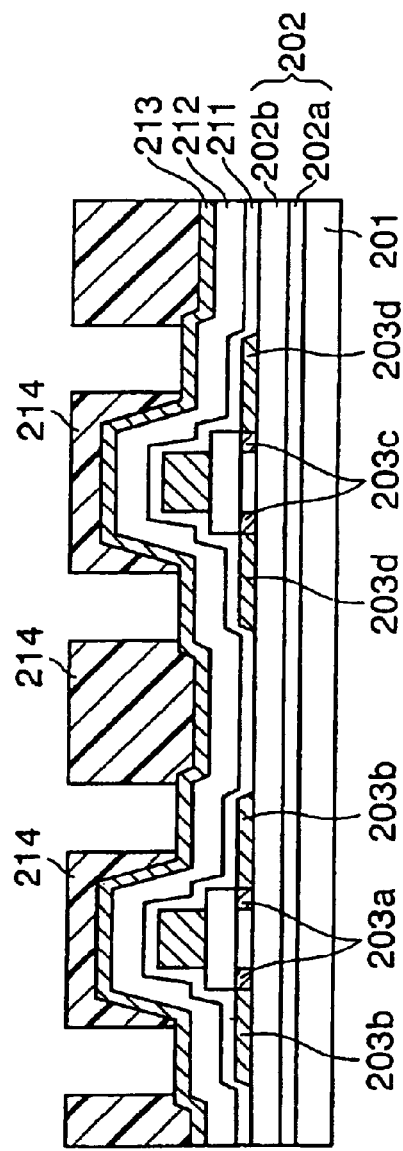

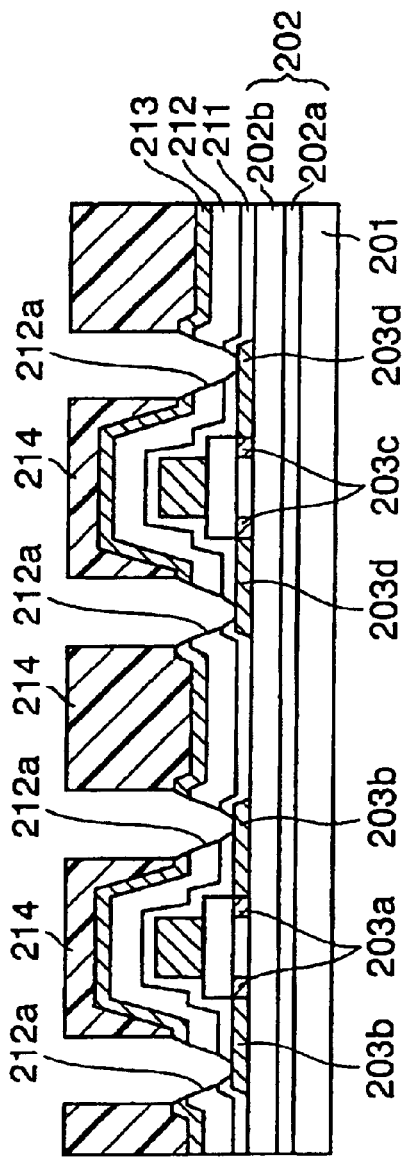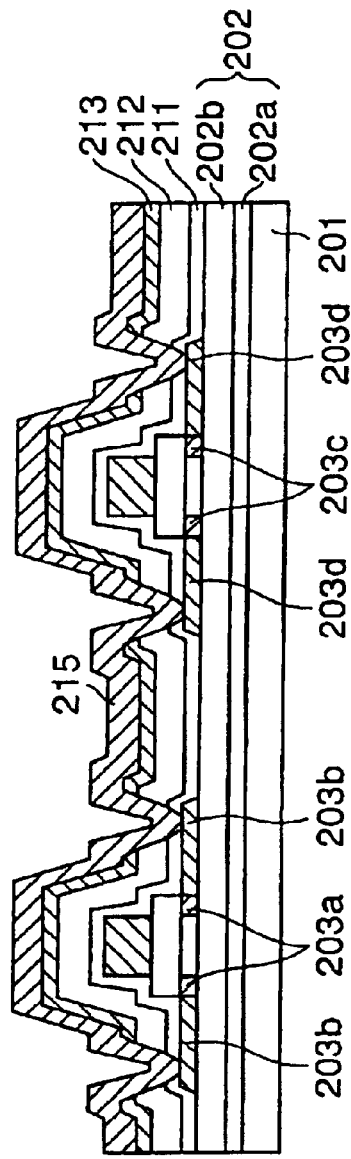

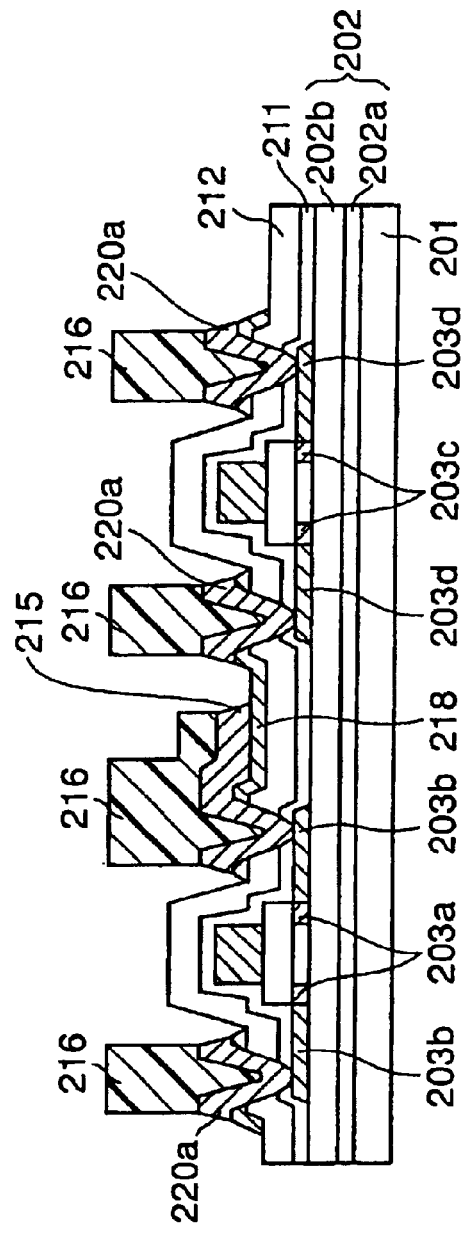
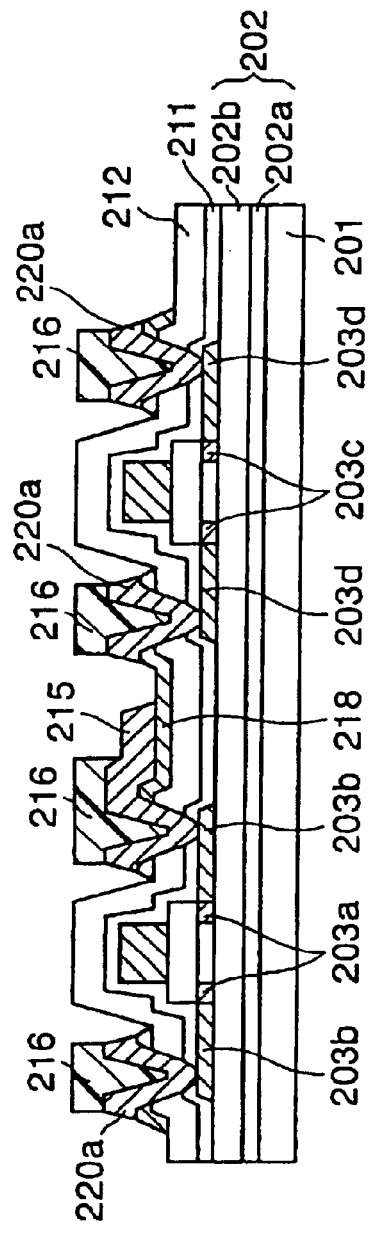

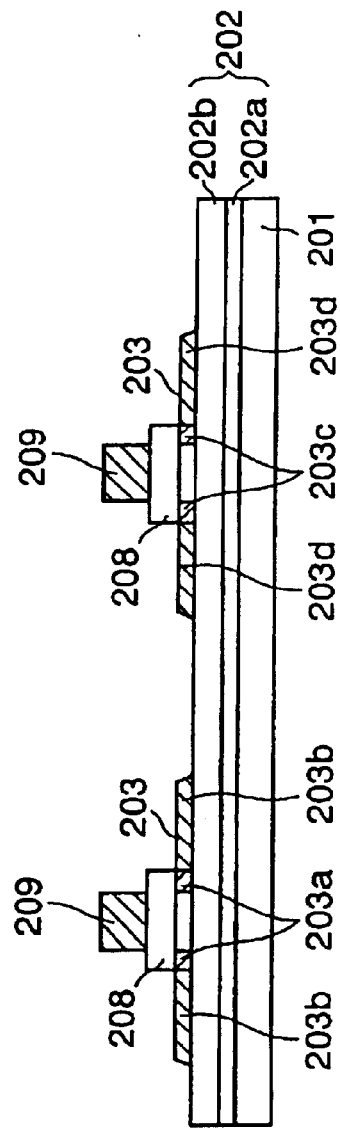
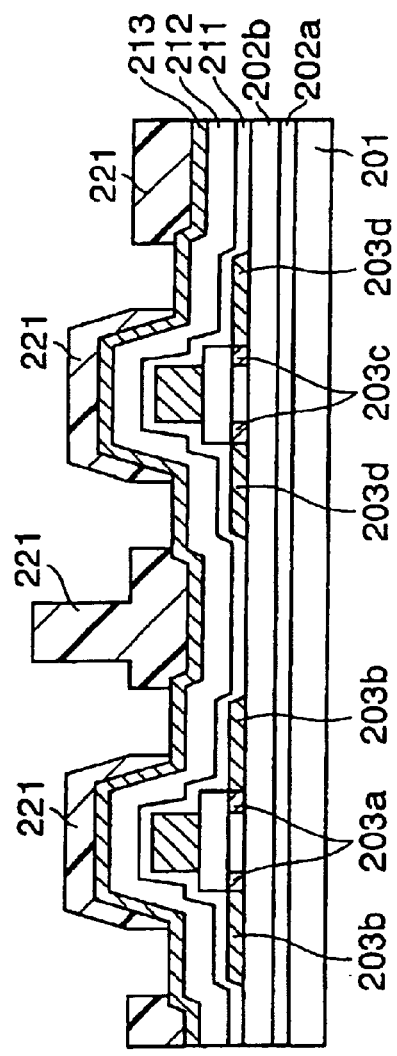
FIG. 22A
FIG. 22B

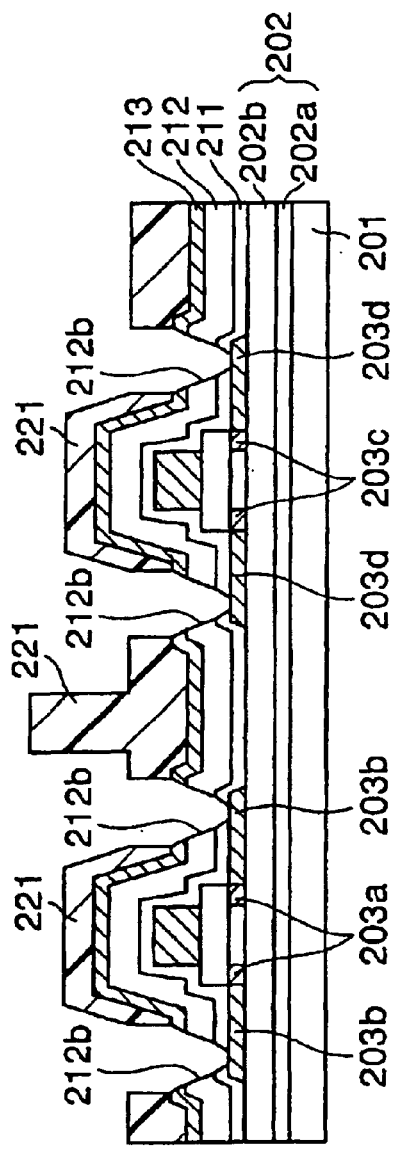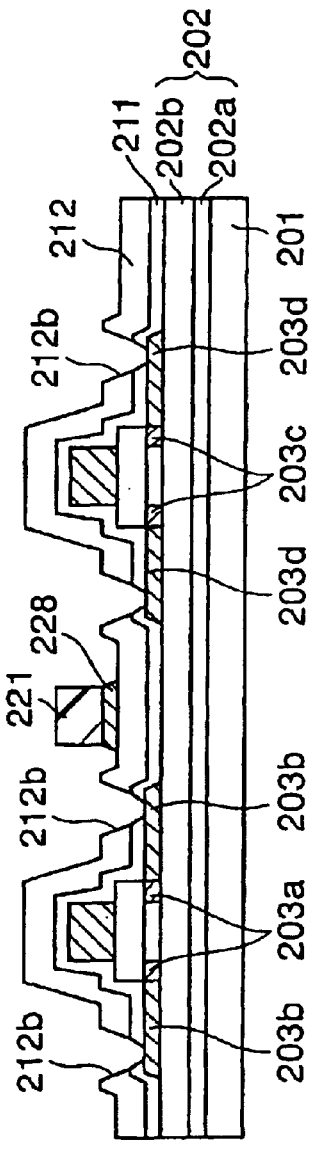

THIN FILM TRANSISTOR DEVICE AND METHOD OF MANUFACTURING THE SAME

CROSS-REFERENCE TO RELATED APPLICATIONS

This is a divisional of application Ser. No. 10/325,603, filed Dec. 19, 2002 now abandoned. This application is based upon and claims priority of Japanese Patent Application No.2001-401483, filed in Dec. 28, 2001, the contents being incorporated herein by reference.

BACKGROUND OF THE INVENTION

1. Field of the Invention

The present invention relates to a thin film transistor device having thin film transistors (abbreviated as "TFTs" hereinafter) used in a liquid crystal display panel, an organic EL display panel, etc. and a method of manufacturing the same.

2. Description of the Prior Art

The liquid crystal display panel has such merits that such panel is thin and light in weight and the consumption power is small because such panel can be driven by the low voltage, and is widely employed in various electronic devices such as PDA (Personal Digital Assistant), the finder of the video camera, and others. In particular, since the active-matrix liquid crystal display panel, in which the switching element such as TFT or the like is provided to each pixel, is excellent in display quality to such an extent that it is equivalent to the CRT (Cathode Ray Tube), such display panel is employed in the display device of the television set, the personal computer, etc.

The normal TN (Twisted Nematic) liquid crystal display panel has the structure that the liquid crystal is sealed between two sheets of transparent glass substrates. Out of two mutually-opposing surfaces (opposing surfaces) of these glass substrates, the black matrix, the color filters, the common electrode, etc. are formed on one surface side, and the TFTs, the pixel electrodes, etc. are formed on the other surface side.

Also, the polarization plate is provided to the opposing surfaces and opposite surfaces of the glass substrates respectively. These two sheets of polarization plates are arranged such that the polarization axes of the polarization plates are set to intersect orthogonally with each other, for example. According to this state, the display panel is set to the mode in which the light is transmitted when the electric field is not applied and the light is shielded when the electric field is applied, i.e., the normally white mode. Also, if the polarization axes of two sheets of polarization plates are set in parallel with each other, the display panel is set to the mode in which the light is shielded when the electric field is not applied and the light is transmitted when the electric field is applied, i.e., the normally black mode. In the following explanation, the substrate on which the TFTs and the pixel electrodes are formed is called the TFT substrate and the substrate on which the color filters and the common electrode are formed is called the CF substrate.

At present, the operating layer of TFT that is formed of amorphous silicon is employed in the normal liquid crystal display panel. However, since the carrier mobility is small in the amorphous silicon, there exists such a drawback that it is hard to apply such operating layer to the large and high-definition liquid crystal display panel. For this reason, the operating layer of TFT that is formed of polysilicon has been proposed, and such operating layer has already been used practically in a part of products.

In such liquid crystal display panel, not only the TFTs formed in the pixel portion (referred to as "pixel TFTs" hereinafter) but also the peripheral circuits such as the data driver, the gate driver, etc., which are constructed by CMOS, etc., can be formed integrally on the substrate. Thus, there is the merit such that the production cost of the liquid crystal display panel can be considerably reduced. In this case, since the OFF current is large in the polysilicon TFT, the LDD (Lightly Doped Drain) structure must be employed in the pixel TFTs.

FIGS. 1A to 1L are sectional views showing a method of manufacturing a TFT substrate of the liquid crystal display panel in the prior art in order of step. In these Figures, for convenience of explanation, the pixel TFT (n-type TFT) is illustrated on the left side and also the p-type TFT of the peripheral circuit is illustrated on the right side. Actually, the pixel TFTs are formed in the display region and the peripheral circuit is formed on the outside of the display region. Also, since the n-type TFTs of the peripheral circuit can be formed similarly to the pixel TFTs, illustration and explanation of them will be omitted herein.

First, as shown in FIG. 1A, a buffer layer 12 having a double-layered structure consisting of a SiN film 12a and a $SiO_2$ film 12b is formed on a glass substrate 11. Then, an amorphous silicon film is formed on the $SiO_2$ film 12b, and then the amorphous silicon is changed into polysilicon by the annealing using the excimer laser to form a polysilicon film 13. Then, photoresist is coated on the polysilicon film 13, and then photoresist films 14 each having a predetermined shape are formed by applying the exposing and developing processes to the photoresist.

Then, as shown in FIG. 1B, the polysilicon film 13 is etched by using the photoresist films 14 as a mask and thus the polysilicon film 13 is left only in the TFT forming region. Then, the photoresist films 14 are removed.

Then, as shown in FIG. 1C, an insulating film 15 and a conductive film 16 are formed sequentially on an overall upper surface of the glass substrate 11. Then, as shown in FIG. 1D, gate electrodes 19 and gate insulating films 18 are formed by etching the conductive film 16 and the insulating film 15 by virtue of the photolithography method. At this time, a width of the gate electrode 19 is formed slightly narrowly rather than a width of the gate insulating film 18.

Then, as shown in FIG. 1E, source/drain regions of the n-type TFT are formed by ion-implanting P (phosphorus) into the polysilicon film 13. For example, high-concentration impurity diffusion regions 13b are formed by ion-implanting P into the polysilicon film 13 with a high concentration at a low energy while using the gate insulating film 18 and the gate electrode 19 as a mask. Also, LDD regions 13a of the n-type TFT are formed by ion-implanting P into the polysilicon film 13 with a low concentration at a high energy while using the gate electrode 19 as a mask.

Then, as shown in FIG. 1F, a resist film 20 for covering the n-type TFT is formed. Then, source/drain regions of the p-type TFT are formed by ion-implanting B (boron) into the polysilicon film 13 in the p-type TFT forming region. For example, high-concentration impurity diffusion regions 13d are formed by ion-implanting B into the polysilicon film 13 with a high concentration at a low energy while using the gate insulating film 18 and the gate electrode 19 as a mask. Also, LDD regions 13c of the p-type TFT are formed by ion-implanting B into the polysilicon film 13 with a low concentration at a high energy while using the gate electrode 19 as a mask. In this manner, the n-type TFT can be changed into the p-type TFT by implanting the p-type impurity into the polysilicon film 13, into which the n-type impurity has been implanted, in larger quantity than the n-type impurity. Then, the resist film 20 is removed.

Then, as shown in FIG. 1G, the impurity being introduced into the polysilicon film 13 is activated by irradiating the excimer laser onto the polysilicon film 13.

Then, as shown in FIG. 1H, a $SiO_2$ film 21 and a SiN film 22 are formed sequentially as an interlayer insulating film on an overall upper surface of the glass substrate 11. Also, an ITO (Indium-Tin Oxide) film 23 is formed on the SiN film 22 and also a resist film 24 is formed on the ITO film 23 in the pixel-electrode forming region.

Then, as shown in FIG. 1I, a pixel electrode 25 is formed by etching the ITO film 23 using the resist film 24 as a mask. Then, the resist film 24 on the pixel electrode 25 is removed.

Then, as shown in FIG. 1J, photoresist is coated on an overall upper surface of the glass substrate 11, and then a resist film 26 in which respective portions corresponding contact-hole forming regions are opened is formed by applying the exposing and developing processes to the photoresist. Then, as shown in FIG. 1K, contact holes 22a reaching the high-concentration impurity diffusion regions 13b, 13d from the surface of the SiN film 22 are formed by etching the SiN film 22 and the $SiO_2$ film 21 while using the resist film 26 as a mask. Then, the resist film 26 is removed.

Then, as shown in FIG. 1L, a metal film is formed on an overall upper surface of the glass substrate 11, and then predetermined wirings (containing the source/drain electrodes) 27 are formed by patterning the metal film by means of the photolithography method. The source region of the pixel TFT is connected electrically to the pixel electrode 25 via the wiring 27. Also, the drain region of the pixel TFT is connected to the data bus line via other wiring 27. In this manner, the TFT substrate of the liquid crystal display panel is completed.

However, the inventors of the present invention consider that the above TFT substrate manufacturing method in the prior art contains the problem described in the following. That is, the method in the prior art needs a number of masking steps, which cause the increase of the production cost. The sub-steps such as the photoresist coating step, the pre-baking step, the exposing step, the developing step, the post-baking step, etc. are contained in the masking steps. Therefore, if the number of the masking steps can be reduced, the production cost of the product can be considerably reduced.

SUMMARY OF THE INVENTION

It is an object of the present invention to provide a thin film transistor device capable of reducing the number of masking steps, and a method of manufacturing the same.

A thin film transistor device set forth in claim 1 of the present invention comprises a substrate; a thin film transistor formed on the substrate; a first insulating film formed on the substrate to cover the thin film transistor; a display electrode formed on the first insulating film in a predetermined pattern; a second insulating film formed on the first insulating film to cover a part of the display electrode; contact holes that reach source/drain regions of the thin film transistor from a surface of the second insulating film; and a wiring formed to extend from an upper surface of the second insulating film to an upper surface of the display electrode, and connected to the source/drain regions of the thin film transistor via the contact holes.

In the present invention, the display electrode is formed on the first insulating film to cover the thin film transistor and also this display electrode is connected electrically to the thin film transistor via the wiring that is formed on the second insulating film (protection film). According to such structure, the number of manufacturing steps can be reduced rather than the prior art.

Also, a thin film transistor device manufacturing method set forth in claim 6 of the present invention comprises the steps of forming a semiconductor film in a first conductivity type thin film transistor forming region and a second conductivity type thin film transistor forming region on a substrate respectively; forming a gate insulating film and a gate electrode on the semiconductor film; forming first conductivity type source/drain regions by introducing a first conductivity type impurity into the semiconductor film; forming a first interlayer insulating film on an overall upper surface of the substrate; forming a first conductive film on the first interlayer insulating film; forming a resist film, which covers the first conductivity type thin film transistor forming region and a display electrode forming region, on the first conductive film; forming second conductivity type source/drain regions by introducing a second conductivity type impurity into the semiconductor film in the second conductivity type thin film transistor forming region; removing the resist film on the first conductivity type thin film transistor forming region to leave the resist film only on the display electrode forming region; forming a display electrode by etching the first conductive film while using the resist film as a mask; removing the resist film from the display electrode forming region; forming a second interlayer insulating film on an overall upper surface of the substrate; forming contact holes that reach source/drain regions of the thin film transistor from a surface of the second interlayer insulating film; forming a second conductive film on the overall upper surface of the substrate; and processing the second conductive film into a predetermined pattern.

Also, a thin film transistor device manufacturing method set forth in claim 10 of the present invention comprises the steps of forming a semiconductor film in a first conductivity type thin film transistor forming region and a second conductivity type thin film transistor forming region on a substrate respectively; forming a gate insulating film and a gate electrode on the semiconductor film; forming first conductivity type source/drain regions by introducing a first conductivity type impurity into the semiconductor film; forming a first interlayer insulating film on an overall upper surface of the substrate; forming a first conductive film on the first interlayer insulating film; forming a resist film thin in the first conductivity type thin film transistor forming region on the first conductive film and thick in the display electrode forming region; removing the first conductive film in the second conductivity type thin film transistor forming region while using the resist film as a mask; forming second conductivity type source/drain regions by introducing a second conductivity type impurity into the semiconductor film in the second conductivity type thin film transistor forming region; removing the resist film on the first conductivity type thin film transistor forming region to leave the resist film only on the display electrode forming region; forming a display electrode by etching the first conductive film while using the resist film as a mask; removing the resist film from the display electrode forming region; forming a second interlayer insulating film on an overall upper surface of the substrate; forming contact holes that reach source/drain regions of the thin film transistor from a surface of the second interlayer insulating film; forming a second conductive film on the overall upper surface of the substrate; and processing the second conductive film into a predetermined pattern.

In the inventions in claims 6 and 10, the display electrode is formed by utilizing the resist film that protects the first conductivity type thin film transistor from the second conductivity type impurity when the second conductivity type impurity is introduced into the semiconductor film in the second conductivity type thin film transistor forming region.

More particularly, the second conductivity type impurity is introduced into the semiconductor film in the second conductivity type thin film transistor forming region, and then the resist film on the first conductivity type thin film transistor forming region is removed to leave the resist film only on the display electrode forming region. Then, the display electrode is formed by etching the first conductive film while using the resist film as a mask.

Accordingly, the number of masking steps can be reduced in contrast to the prior art, and thus the production cost of the thin film transistor device can be reduced.

Also, a thin film transistor device manufacturing method set forth in claim 13 of the present invention comprises the steps of forming a semiconductor film in a thin film transistor forming region on a substrate; forming a gate insulating film and a gate electrode on the semiconductor film; forming an interlayer insulating film on an overall upper surface of the substrate; forming a first conductive film as a display electrode on the interlayer insulating film; forming contact holes, which reach the semiconductor film from a surface of the first conductive film, by a photolithography method; forming a second conductive film on the overall upper surface of the substrate; forming a resist film, which covers a wiring forming region and a display electrode forming region, on the second conductive film; etching the second conductive film and the first conductive film while using the resist film as a mask; removing the resist film in the display electrode forming region to leave the resist film in the wiring forming region; and removing the second conductive film on the display electrode forming region by an etching using the resist film as a mask.

In the present invention, the second conductive film serving as the wiring is formed on the first conductive film serving as the display electrode. Then, the display electrode is formed by utilizing the mask used when the second conductive film is etched.

More particularly, the first conductive film and the second conductive film on other regions are etched in the state that the first conductive film and the second conductive film in the wiring forming region and the display electrode forming region are protected by the resist film. Then, the resist film on the display electrode forming region is removed while leaving the resist film on the wiring forming region as it is. Then, the second conductive film formed on the first conductive film in the display electrode forming region is removed by the etching to expose the first conductive film.

In the present invention, the display electrode is formed in this manner. Therefore, the number of masking steps can be reduced in contrast to the prior art, and thus the production cost of the thin film transistor device can be reduced.

Also, a thin film transistor device manufacturing method set forth in claim 17 of the present invention comprises the steps of forming a semiconductor film in a thin film transistor forming region on a substrate; forming a gate insulating film and a gate electrode on the semiconductor film; forming an interlayer insulating film on an overall upper surface of the substrate; forming a first conductive film as a display electrode on the interlayer insulating film; forming a resist film, in which contact hole forming regions are opened, on the first conductive film; forming contact holes, which reach the semiconductor film from a surface of the first conductive film, by executing an etching while using the resist film as a mask; removing the resist film to leave only on the display electrode forming region; etching the first conductive film while using the resist film remaining on the display electrode forming region as a mask; removing the resist film on the display electrode forming region; forming a second conductive film on the overall upper surface of the substrate; and processing the second conductive film into a predetermined shape.

In the present invention, the display electrode is formed by utilizing the resist film used when the contact holes are formed. More particularly, the first conductive film serving as the display electrode is formed on the interlayer insulating film, then the resist film is formed on the first conductive film in a predetermined pattern, and then the contact holes reaching the source/drain regions of the thin film transistor are formed by etching the first conductive film and the interlayer insulating film. Then, the resist film is left only in the display electrode forming region but the resist film in other regions is removed. Then, the display electrode is formed by etching the first conductive film while using the remaining resist film as a mask.

In the present invention, the display electrode is formed in this manner. Therefore, the number of masking steps can be reduced in contrast to the prior art, and thus the production cost of the thin film transistor device can be reduced.

Also, a thin film transistor device set forth in claim 21 of the present invention comprises a substrate; a semiconductor film formed on the substrate and having source/drain regions of an LDD structure; a first insulating film formed on the substrate and the semiconductor film; a gate electrode constructed by a first conductive film, which is formed on the first insulating film over the semiconductor film, and a second conductive film, which is formed on the first conductive film to have a width narrower than the first conductive film; a display electrode formed on the first insulating film and made of a same material as the first conductive film; a second insulating film formed on the first insulating film to cover the gate electrode; contact holes that reach the semiconductor film from a surface of the second insulating film; and a wiring formed on the second insulating film, one end of which is connected electrically to the semiconductor film via the contact hole and other end of which is connected electrically to the display electrode.

In the present invention, the gate electrode is composed of the first conductive film and the second conductive film whose width is narrower than the first conductive film. Also, the display electrode is formed of the same material as the first conductive film. According to such structure, the number of manufacturing steps of the thin film transistor device, which has the thin film transistor of the LDD structure, can be reduced rather than the prior art.

Also, a thin film transistor device manufacturing method set forth in claim 25 of the present invention comprises the steps of forming a semiconductor film in a thin film transistor forming region on a substrate; forming sequentially a first insulating film, a first conductive film, and a second conductive film on an overall upper surface of the substrate; forming a resist film in a display electrode forming region and a gate electrode forming region on the second conductive film; forming a display electrode and a gate electrode having a terrace structure by applying an isotropic etching to the second conductive film and by applying an anisotropic etching to the first conductive film while using the resist film as a mask; removing the resist film on the display electrode forming region to leave the resist film on the gate electrode forming region; removing the second conductive film remaining on the display electrode; removing the resist film from the gate electrode forming region; forming source/drain regions by introducing an impurity into the semiconductor film; forming a second interlayer insulating film on the overall upper surface of the substrate; patterning the second interlayer insulating film to expose the display electrode and to form contact holes that reach the semiconductor film from a surface of the second interlayer insulating film; forming a third conductive film on the overall upper surface of the substrate; and forming a wiring, which connects electrically the semiconductor film and the display electrode, by patterning the third conductive film.

In the present invention, the second conductive film is formed on the first conductive film, and then the resist film is formed on the second conductive film. Then, the isotropic etching is applied to the second conductive film while using the resist film as a mask and also the anisotropic etching is applied to the first conductive film, so that the gate electrode having the terrace structure consisting of the first conductive film and the second conductive film is formed and also the display electrode made of the first conductive film is formed.

Then, the resist film is left in the gate electrode forming region and the resist film is removed from the display electrode forming region. Then, the second conductive film remaining on the display electrode is removed by the etching.

In the present invention, in this manner, the display electrode and the gate electrode having the terrace structure are formed by one masking step. Therefore, the number of masking step can be reduced rather than the prior art and also the production cost of the thin film transistor device can be reduced.

BRIEF DESCRIPTION OF THE DRAWINGS

FIGS. 1A to 1L are sectional views showing a method of manufacturing a thin film transistor device (liquid crystal display panel) in the prior art in order of step;

FIGS. 21A to 21M are sectional views showing a method of manufacturing a thin film transistor device (liquid crystal display panel) according to a third embodiment of the present invention in order of step;

FIGS. 22A to 22E are sectional views showing a method of manufacturing a thin film transistor device (liquid crystal display panel) according to a fourth embodiment of the present invention in order of step.

DESCRIPTION OF THE PREFERRED EMBODIMENTS

Embodiments of the present invention will be explained with reference to the accompanying drawings hereinafter.

(First Embodiment)

Figure 1C:
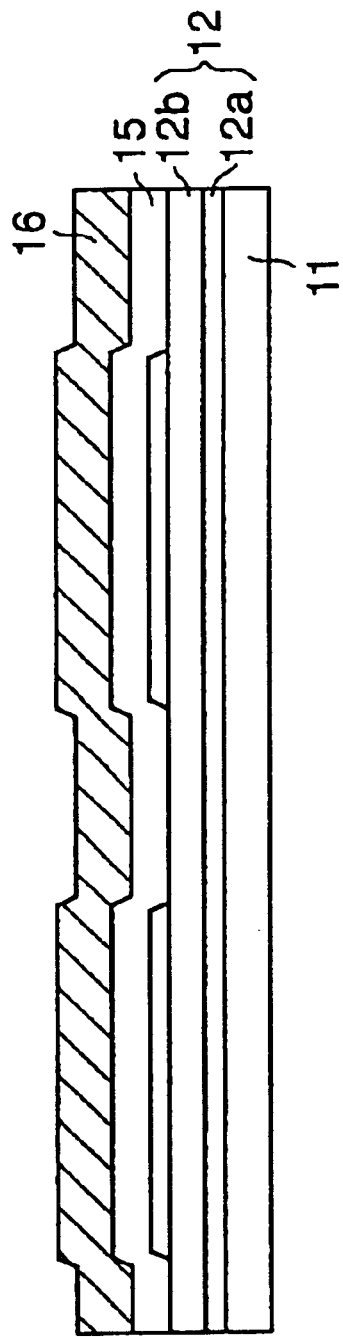
Figure 1D:
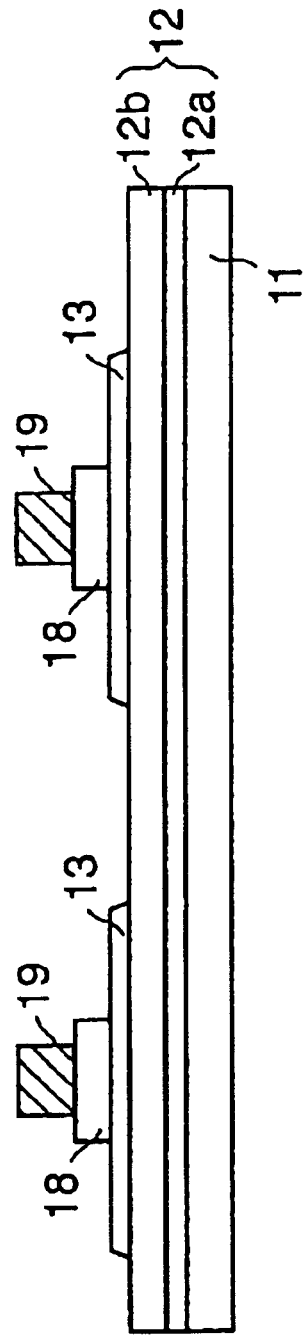
Figure 2:
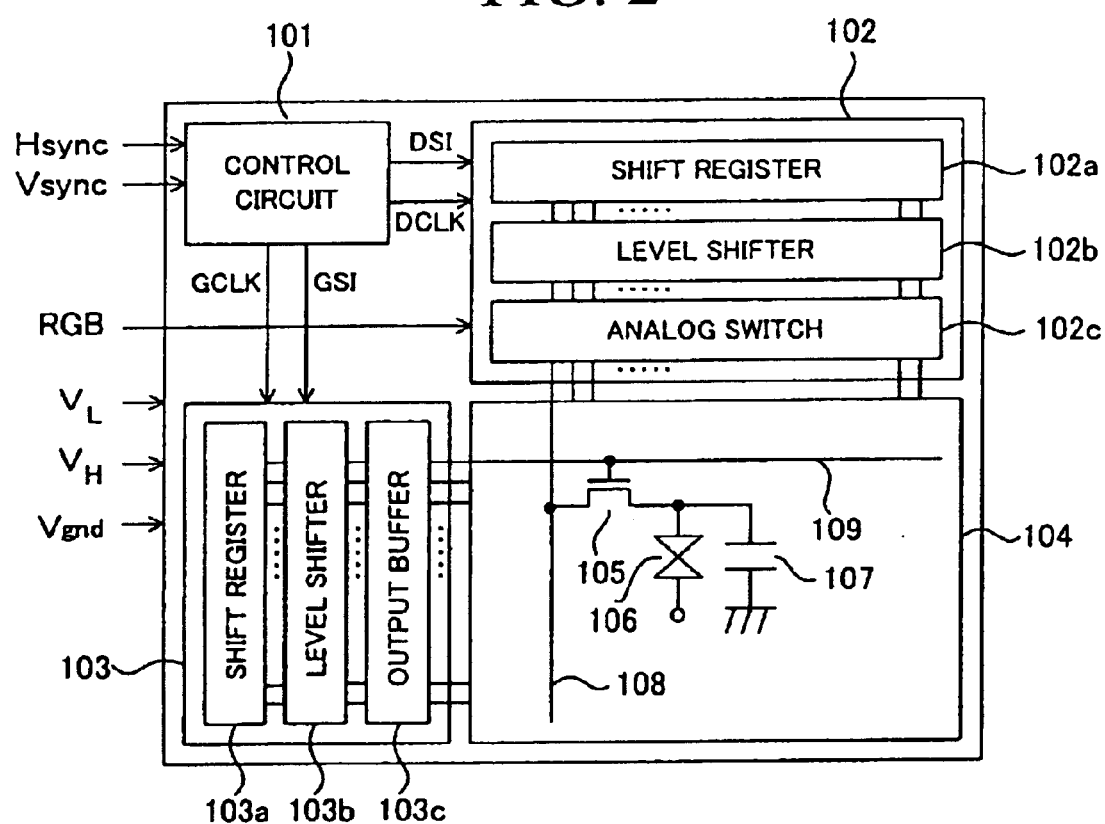
FIG. 2 is a block diagram showing a configuration of a thin film transistor device (transmissive liquid crystal display panel) according to a first embodiment of the present invention.

FIG. 2 is a block diagram showing a configuration of a thin film transistor device (transmissive liquid crystal display panel) according to a first embodiment of the present invention. In the following example, the XGA (1024×768 pixel) mode liquid crystal display panel will be explained hereunder.

The liquid crystal display panel according to the present embodiment consists of a control circuit 101, a data driver 102, a gate driver 103, and a display portion 104. The signals such as display signals RGB (R (red) signal, G (green) signal, and B (blue) signal), a horizontal synchronizing signal Hsync, a vertical synchronizing signal Vsync, etc. are supplied to this liquid crystal display panel from the external devices (not shown) such as the computer, etc. Also, a high voltage VH (e.g., 18 V), a low voltage VL (e.g., 3.3 V or 5 V) and a ground potential Vgnd are supplied to the liquid crystal display panel from the power supplies (not shown).

In the display portion 104, 3072 (1024×RGB) pixels are aligned in the horizontal direction and also 768 pixels are aligned in the vertical direction. Each pixel consists of an n-type TFT 105, and a display cell 106 and a storage capacitor 107, both are connected to the source electrode of the n-type TFT 105. The display cell 106 consists of a pair of electrodes and the liquid crystal sealed between these electrodes.

Also, 3072 data bus lines 108 that extend in the vertical direction and 768 gate bus lines 109 that extend in the horizontal direction are provided to the display portion 104. The gate electrodes of the TFTs 105 of the pixels that are aligned in the horizontal direction are connected to the same gate bus line 109, and the drain electrodes of the TFTs 105 of the pixels that are aligned in the vertical direction are connected to the same data bus line 108.

The control circuit 101 receives the horizontal synchronizing signal Hsync and the vertical synchronizing signal Vsync, and then outputs a data start signal DSI that becomes active at a point of time when one horizontal synchronizing period is started, a data clock DCLK that divides one horizontal synchronizing period into predetermined intervals, a gate start signal GSI that becomes active at a point of time when one vertical synchronizing period is started, and a gate clock GCLK that divides one vertical synchronizing period into predetermined intervals.

The data driver 102 consists of a shift register 102a, a level shifter 102b, and an analog switch 102c.

The shift register 102a has 3072 output terminals. This shift register 102a is initialized by the data start signal DSI, and outputs the low-voltage active signal from respective output terminals sequentially at the timing that is synchronized with the data clock DCLK.

The level shifter 102b has 3072 input terminals and 3072 output terminals. Then, the level shifter 102b converts the low-voltage active signal, which is output from the shift register 102a, into the high voltage active signal and then outputs such active signal.

The analog switch 102c has also 3072 input terminals and 3072 output terminals. Output terminals of the analog switch 102c are connected to corresponding data bus lines 108 respectively. The analog switch 102c, when receives the active signal from the level shifter 102b, outputs the display signal RGB (any one of the R signal, the G signal, and the B signal) to the output terminal corresponding to the input terminal via which the active signal is input.

More particularly, the data driver 102 outputs the R signal, the G signal, and the B signal sequentially to the 3072 data bus lines 108 of the display portion 104 at the timing, that is synchronized with the data clock DCLK, within one horizontal synchronizing period.

The gate driver 103 consists of a shift register 103a, a level shifter 103b, and an output buffer 103c.

The shift register 103a has 768 output terminals. This shift register 103a is initialized by the gate start signal GSI, and outputs the low-voltage scanning signal from respective output terminals sequentially at the timing that is synchronized with the gate clock GCLK.

The level shifter 103b has 768 input terminals and 768 output terminals. Then, the level shifter 103b converts the low-voltage scanning signal, which is input from the shift register 103a, into the high-voltage scanning signal and then outputs such high-voltage scanning signal.

The output buffer 103c has also 768 input terminals and 768 output terminals. Output terminals of the output buffer 103c are connected to corresponding gate bus lines 109 respectively. The output buffer 103c supplies the scanning signal, which is input from the level shifter 103b, to the gate bus line 109 via the output terminal that corresponds to the input terminal.

More particularly, the gate driver 103 supplies the scanning signal sequentially to the 768 gate bus lines 109 of the display portion 104 at the timing, that is synchronized with the gate clock GCLK, within one vertical synchronizing period.

The TFT 105 of the display portion 104 is turned ON when the scanning signal is supplied to the gate bus line 109. At this time, when the display signal RGB (any one of the R signal, the G signal, and the B signal) is supplied to the data bus line 108, such display signal RGB is written into the display cell 106 and the storage capacitor 107. The gradient of the liquid crystal molecules is changed by the written display signal RGB in the display cell 106, and as a result the optical transmittance of the display cell 106 is changed. The desired image can be displayed by controlling the optical transmittance of the display cell 106 every pixel.

In the present embodiment, as described above, the TFT 105 in the pixel is the n-type TFT. Also, the control circuit 101, the data driver 102, and the gate driver 103 are constructed by the p-type TFTs and the n-type TFTs.

Figure 3:
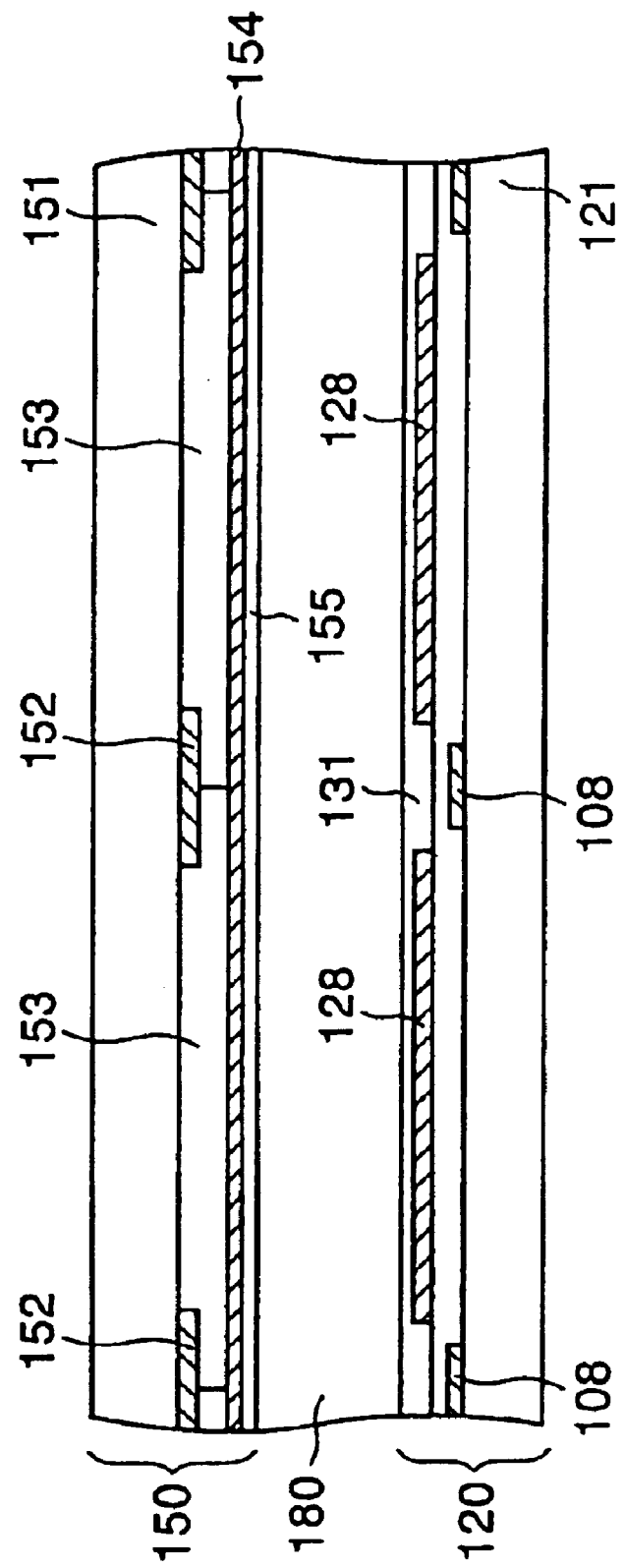
FIG. 3 is a sectional view showing a display portion of the thin film transistor device (liquid crystal display panel) according to the first embodiment of the present invention.
Figure 4:
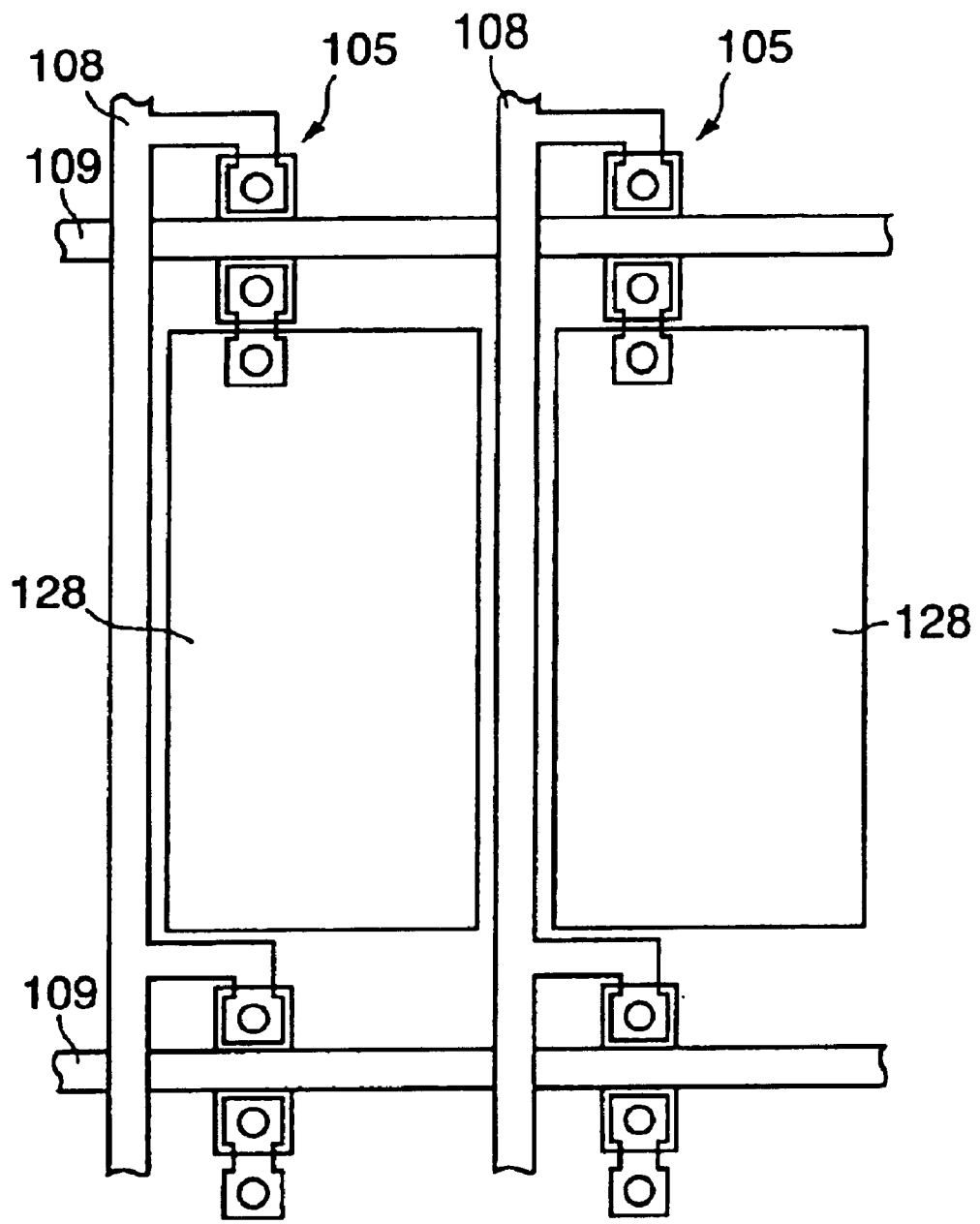
FIG. 4 is a plan view showing a TFT substrate in the display portion of the same.

FIG. 3 is a sectional view showing the display portion of the liquid crystal display panel according to the first embodiment of the present invention, and FIG. 4 is a plan view showing the TFT substrate in the display portion of the same. In this case, although actually the storage capacitor 107 shown in FIG. 2 is formed every pixel, the illustration and the explanation will be omitted herein.

As shown in the sectional view of FIG. 3, the liquid crystal display panel of the present embodiment consists of a TFT substrate 120 and a CF substrate 150 that are arranged to oppose to each other, and a liquid crystal 180 that is sealed between the TFT substrate 120 and the CF substrate 150.

The TFT substrate 120 is constructed by a glass substrate (transparent insulating substrate) 121, the data bus lines 108 that are formed on the glass substrate 121, the gate bus lines 109, the TFTs 105, and pixel electrodes (display electrodes) 128, etc. In the present embodiment, a part of the gate bus lines 109 acts as the gate electrodes of the TFTs 105, the source electrodes of the TFTs 105 are connected to the pixel electrodes 128, and the drain electrodes of the TFTs 105 are connected to the data bus lines 108. Also, an alignment film 131 is formed on the pixel electrodes 128.

While, the CF substrate 150 is constructed by a glass substrate (transparent insulating substrate) 151, a black matrix 152 that is formed on the glass substrate 151, color filters 153, and a common electrode 154. The black matrix 152 is formed to cover regions between the pixels and the TFT forming regions. Also, the color filter 153 having any one color of the red color, the green color, and the blue color is formed every pixel. In the present embodiment, the common electrode 154 is formed on the color filters 153, and a surface of the common electrode 154 is covered with an alignment film 155.

The TFT substrate 120 and the CF substrate 150 are arranged such that their surfaces on which the alignment films 131, 155 are formed respectively are opposed to each other.

Figure 5:
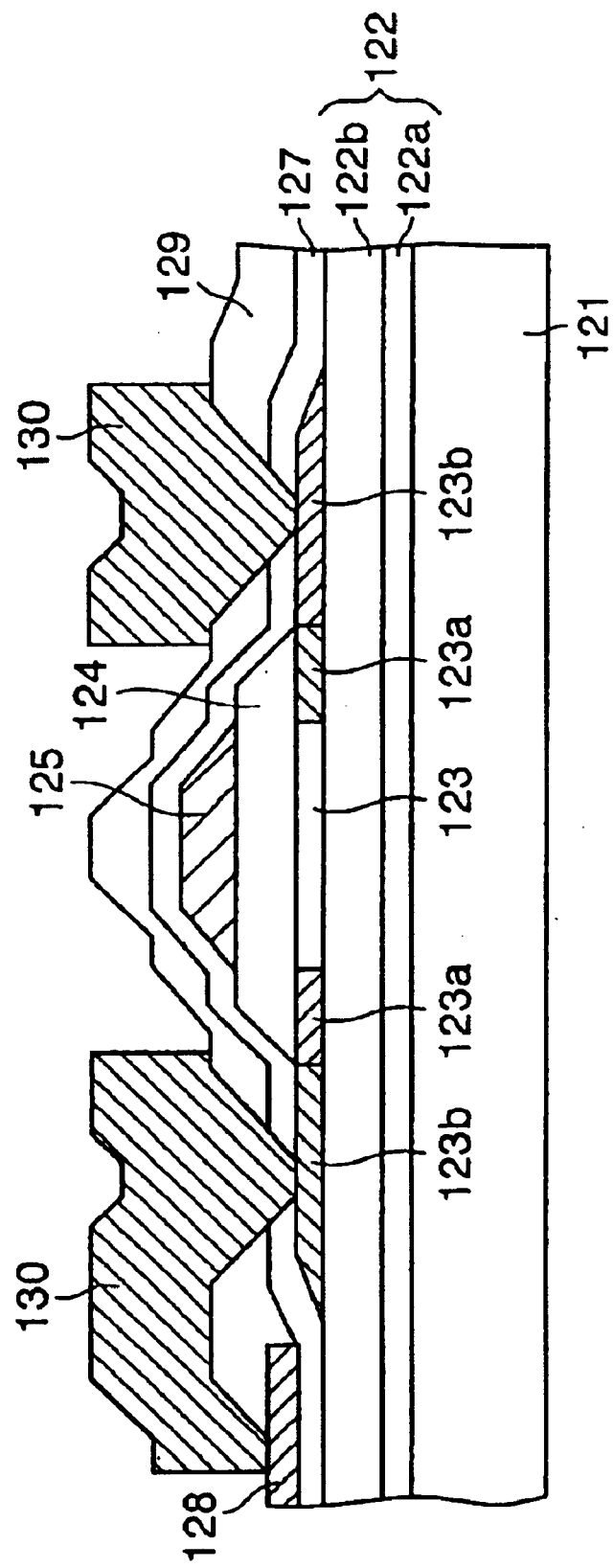
FIG. 5 is a sectional view showing a cross section of a TFT forming region of the thin film transistor device according to the first embodiment of the present invention.

FIG. 5 is a sectional view showing a cross section of the TFT forming region of the TFT 105. A structure of the TFT substrate 120 will be explained in more detail with reference to FIG. 5 hereunder. In this case, illustration of the alignment film 131 is omitted from FIG. 5.

A buffer layer 122 consisting of a SiN film 122a and a $SiO_2$ film 122b is formed on the glass substrate 121. A polysilicon film 123 acting as the operating layer of the TFT 105 is formed on a predetermined region of the buffer layer 122.

The source/drain regions having the LDD structure are formed in this polysilicon film 123. In other words, a pair of LDD regions (low-concentration impurity diffusion regions) 123a are formed in the polysilicon film 123 so as to put the channel region therebetween. Also, high-concentration impurity diffusion regions 123b are formed on the outside of a pair of LDD regions 123a respectively.

A gate insulating film 124 is formed on the channel region and the LDD regions 123a of the polysilicon film 123. A gate electrode 125 (the gate bus line 109) is formed on the gate insulating film 124. In the present embodiment, a width of the gate electrode 125 is formed slightly narrowly rather than a width of the gate insulating film 124.

A first interlayer insulating film 127 is formed on the buffer layer 122 to cover the TFT 105. The pixel electrodes 128 are formed on predetermined regions of the first interlayer insulating film 127. Also, a second interlayer insulating film (protection film) 129 is formed on the first interlayer insulating film 127. In this case, portions that correspond to the pixel electrodes 128 are opened in the second interlayer insulating film 129 so as to expose the pixel electrodes 128.

The data bus lines 108 and other wirings 130 are formed on the second interlayer insulating film 129. The data bus line 108 is connected electrically to the drain region of the TFT 105 via the wiring 130 and the contact hole provided in the interlayer insulating films 127, 129. Also, the pixel electrode 128 is connected electrically to the source region of the TFT 105 via other wiring 130 and other contact hole.

FIG. 6 to FIG. 17 are sectional views showing a method of manufacturing the TFT substrate having the above structure in order of step.

Figure 6:
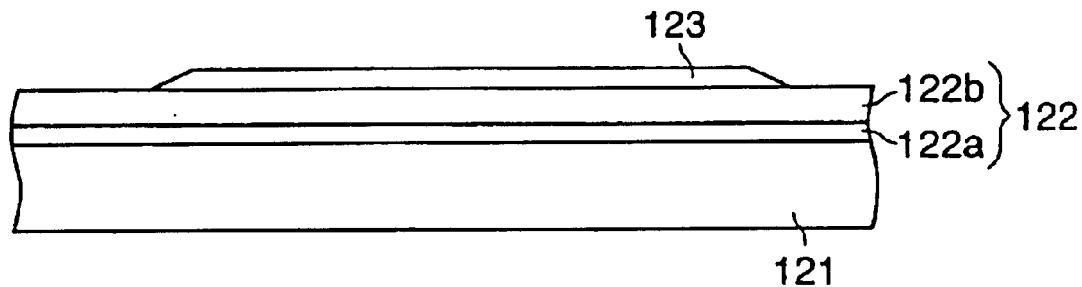
FIG. 6, FIG. 7, FIG. 8, FIG. 9, FIG. 10, FIGS. 11A and 11B, FIGS. 12A and 12B, FIG. 13, FIG. 14, FIG. 15, FIG. 16, FIG. 17 are sectional views showing a method of manufacturing the thin film transistor device according to the first embodiment of the present invention in order of step.

First, as shown in FIG. 6, the buffer layer 122 having the double-layered structure that consists of the SiN film 122a of 50 nm thickness and the $SiO_2$ film 122b of 100 nm thickness is formed by depositing sequentially SiN and $SiO_2$ onto the glass substrate 121 by virtue of the plasma CVD method. Then, an amorphous silicon film is formed on the buffer layer 122 by the plasma CVD method to have a thickness of about 40 nm, and then the polysilicon film 123 is formed by applying the laser annealing process to the amorphous silicon film. Then, the polysilicon film 123 is shaped into island shapes by the photolithography method.

Figure 7:
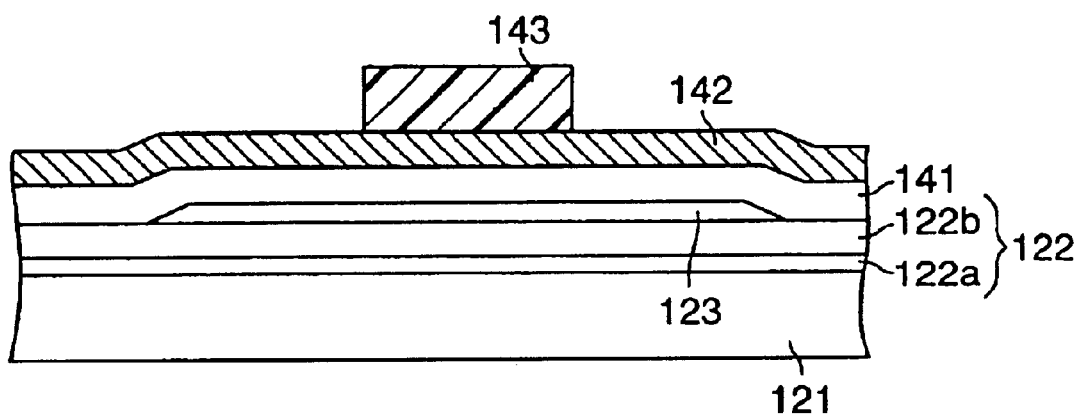

Then, as shown in FIG. 7, a $SiO_2$ film 141 serving as the gate insulating film 124 is formed on an overall upper surface of the glass substrate 121 to have a thickness of about 100 nm. Then, an AlNd film 142 serving as the gate electrode 125 is formed on the $SiO_2$ film 141 to have a thickness of about 300 nm.

Then, the photoresist is coated on the AlNd film 142, and then a resist film 143 having a desired shape is formed by applying the exposing and developing processes to the photoresist.

Figure 8:
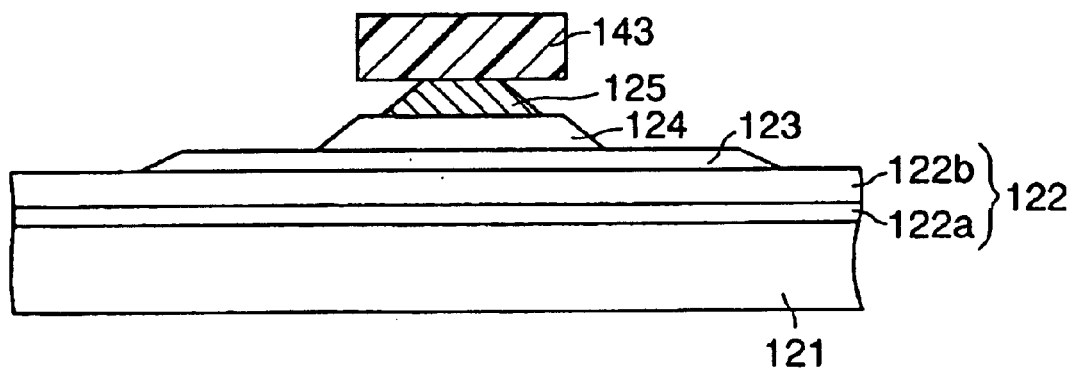

Then, as shown in FIG. 8, the gate electrode 125 (gate bus line 109) and other wiring (not shown) are formed by applying the wet etching (isotropic etching) to the AlNd film 142 while using the resist film 143 as a mask. At this time, an interval between the edge of the resist film 143 and the edge of the gate electrode 125 (distance in the horizontal direction) is set to 0.3 to 2 μm by over-etching the AlNd film 142. Also, the gate insulating film 124 having the almost same width as the resist film 143 is formed by applying the dry etching (anisotropic etching) to the $SiO_2$ film 141 by the fluoride system gas, for example, with using the resist film 143 as a mask. Then, the resist film 143 is removed.

In the present embodiment, in this manner, the terrace structure consisting of the gate insulating film 124 and the gate electrode 125 whose width is narrower than the gate insulating film 124 can be formed by one masking step.

In this case, in the present embodiment, as described later, the LDD regions 123a and the high-concentration impurity diffusion regions 123b are formed by one masking step while utilizing the terrace structure consisting of the gate insulating film 124 and the gate electrode 125. At this time, if an interval between the edge of the gate insulating film 124 and the edge of the gate electrode 125 in the horizontal direction is below 0.3 μm, the effect of forming the LDD regions 123a is not sufficient. In contrast, if the interval between the edge of the gate insulating film 124 and the edge of the gate electrode 125 in the horizontal direction is in excess of 2 μm, a size of the thin film transistor is increased and thus the higher definition becomes difficult. As a result, it is preferable that the interval between the edge of the gate insulating film 124 and the edge of the gate electrode 125 should be set to 0.3 to 2 μm.

Figure 9:
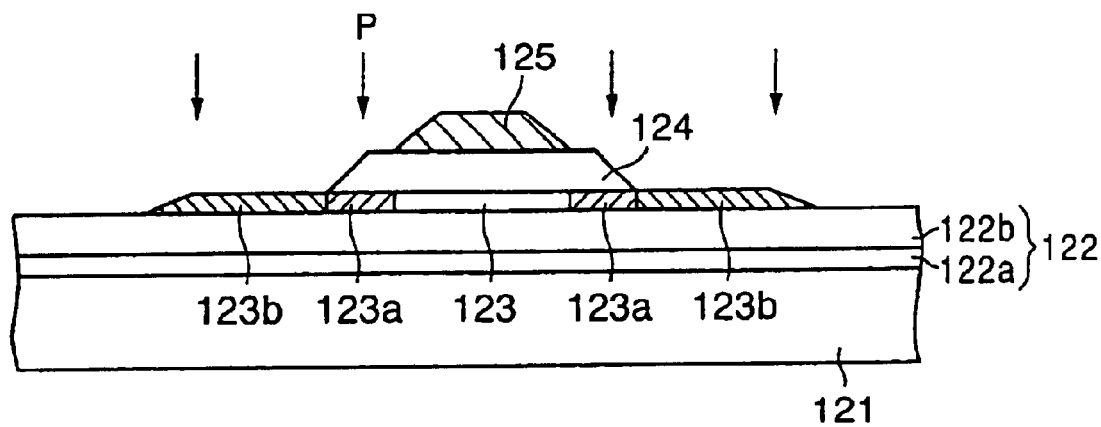

Then, as shown in FIG. 9, the source/drain regions of the TFT 105 are formed by ion-implanting P (phosphorous) into the polysilicon film 123. For example, the high-concentration impurity diffusion regions 123b are formed by ion-implanting P into the polysilicon film 123 at the acceleration energy of 10 keV and the dosage of $1.0 \times 10^{15}$ $cm^{-2}$ while using the gate electrode 125 and the gate insulating film 124 as a mask. Also, the LDD regions 123a are formed by ion-implanting P into the polysilicon film 123 at the acceleration energy of 70 keV and the dosage of $5.0 \times 10^{13}$ $cm^{-2}$ while using the gate electrode 125 as a mask.

Figure 10:
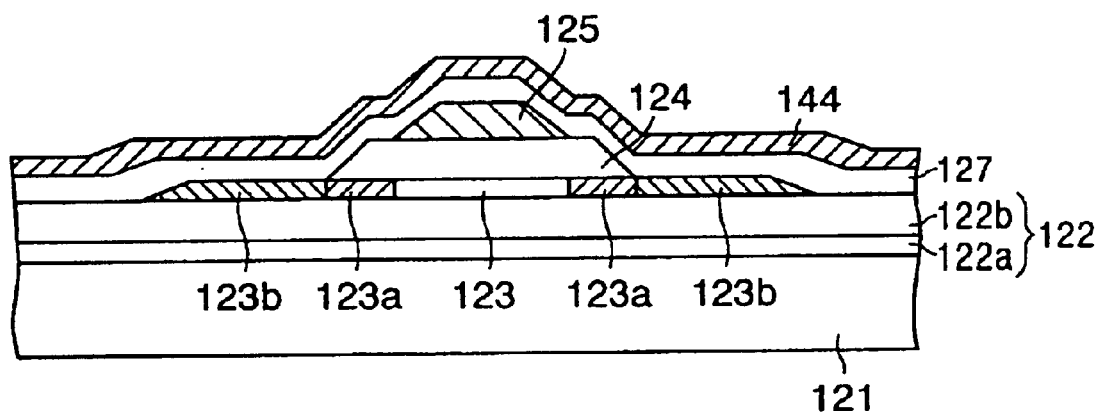

Then, as shown in FIG. 10, an $SiO_2$ film of about 60 nm thickness is formed as the first interlayer insulating film 127 on the overall upper surface of the glass substrate 121 by the CVD method. Then, an ITO film 144 of about 70 nm thickness is formed on the first interlayer insulating film 127 by the sputter method.

In this case, the material of the pixel electrode 128 is not limited to ITO. However, in the case of the transmissive liquid crystal display panel, the transparent conductive material must be employed. As the transparent conductive material, there is the oxide containing In, Sn, or Zn, for example.

Figure 11A:
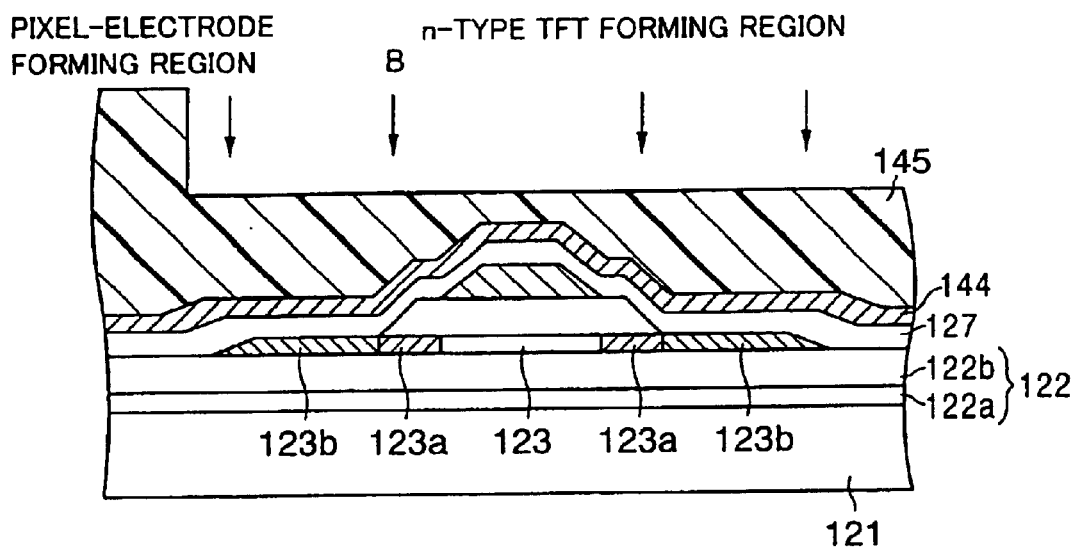
Figure 11B:
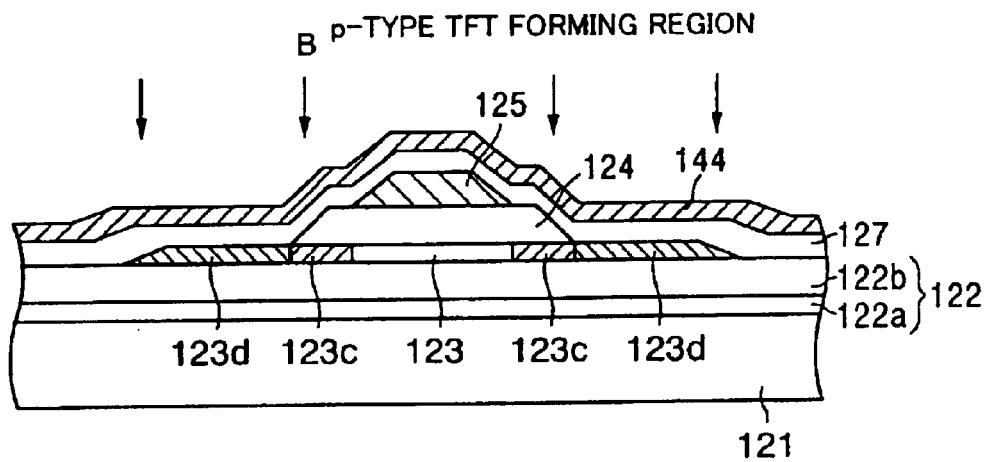

Then, as shown in FIGS. 11A and 11B, a resist film 145 that is thick in the pixel-electrode forming region, and is thin in the n-type TFT forming region and has openings in the portions that correspond to the p-type TFT forming region is formed.

For example, after the photoresist film 145 is formed on the entire surface, the half-exposure is carried out by using the first exposure mask, which shields the n-type TFT forming region and the pixel-electrode forming region from the light, and the second exposure mask, which shields the n-type TFT forming region only from the light, respectively. At this time, the magnitude of the level difference between the resist film in the n-type TFT forming region and the resist film in the pixel-electrode forming region can be changed by controlling an amount of exposure at the first time exposure and the second time exposure. Also, if the exposure mask that shields perfectly the pixel-electrode forming region from the light and that has a number of opening portions, whose diameter is smaller than the critical value of the resolution, in the portion that corresponds to the n-type TFT forming region is employed, the resist film having the thick portion and the thin portion can be formed by one exposure.

In the present embodiment, the thickness of the resist film 145 in the n-type TFT forming region is set to 1.0 μm, and the thickness of the resist film 145 in the pixel-electrode forming region is set to 1.5 μm. However, these numerical values must be changed appropriately according to the process.

Then, the source/drain regions are formed by ion-implanting B (boron) into the polysilicon film 123 in the p-type TFT forming region while protecting the pixel-electrode forming region and the n-type TFT forming region with the resist film 145. For example, the high-concentration impurity diffusion regions 123d are formed by ion-implanting B into the polysilicon film 123 at the acceleration energy of 10 keV and the dosage of $2 \times 10^{15}$ $cm^{-2}$ while using the gate electrode 125 and the gate insulating film 124 as a mask. Also, the LDD regions 123c are formed by ion-implanting B into the polysilicon film 123 at the acceleration energy of 70 keV and the dosage of $2.0 \times 10^{14}$ $cm^{-2}$ while using the gate electrode 125 as a mask.

Figure 18A:
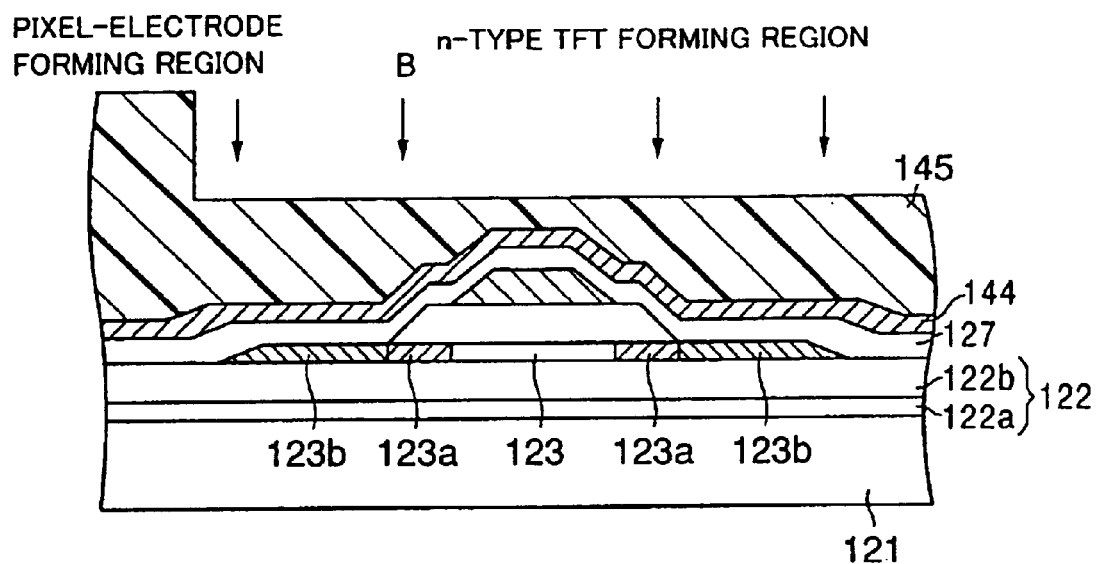
FIGS. 18A and 18B are sectional views showing a variation of the method of manufacturing the thin film transistor device according to the first embodiment of the present invention.
Figure 18B:
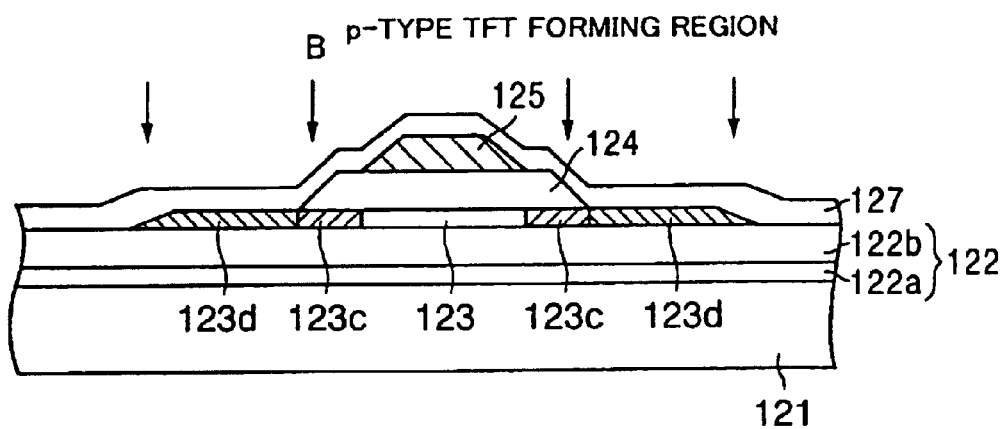

In this case, as shown in FIG. 18A and FIG. 18B, after the ITO film 144 on the p-type TFT forming region is removed, the LDD regions 123c and the high-concentration impurity diffusion regions 123d may be formed by implanting the boron into the polysilicon film 123.

Figure 12A:
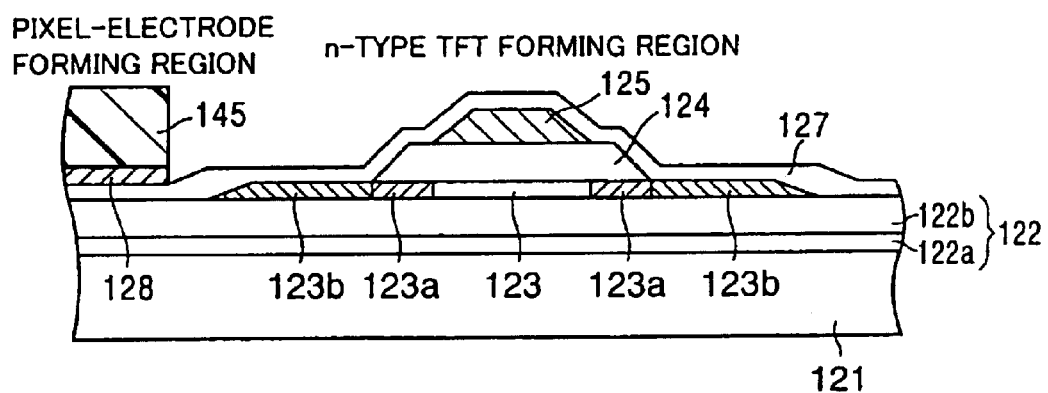
Figure 12B:
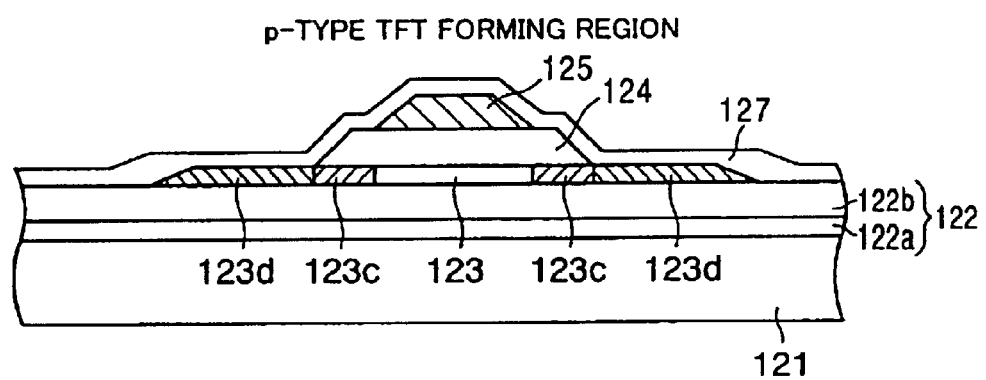
Figure 13:
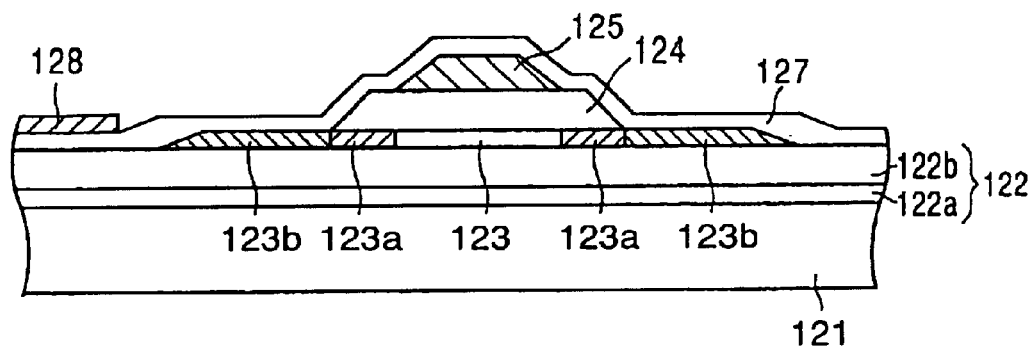

Then, as shown in FIGS. 12A and 12B, the resist film 145 is left only in the pixel-electrode forming region by applying the oxygen plasma process (ashing) to the resist film 145. Then, the pixel electrode 128 is formed by etching the ITO film 144 while using the resist film 145 as a mask. Then, as shown in FIG. 13, the resist film 145 on the pixel electrode 128 is removed.

Then, the impurities (P and B) introduced into the polysilicon film 123 are activated by applying the annealing process, the laser beam irradiating process, or the like.

Figure 14:
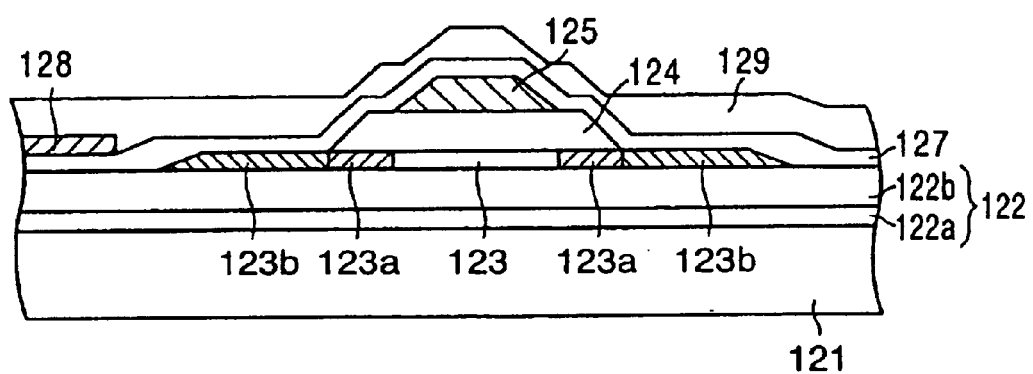

Then, as shown in FIG. 14, the second interlayer insulating film 129 of about 400 nm thickness is formed by depositing SiN on an overall upper surface of the glass substrate 121.

Figure 15:
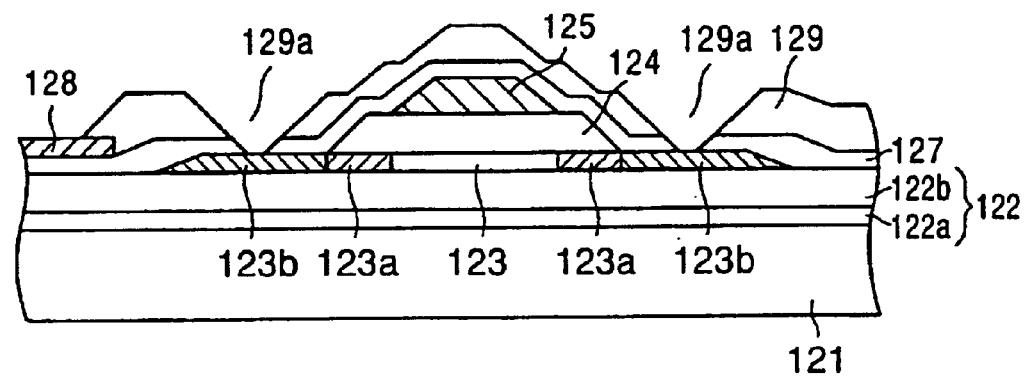

Then, as shown in FIG. 15, contact holes 129a that reach the high-concentration impurity diffusion regions 123b, 123d from a surface of the second interlayer insulating film 129 respectively are formed by the photolithography method.

Figure 16:
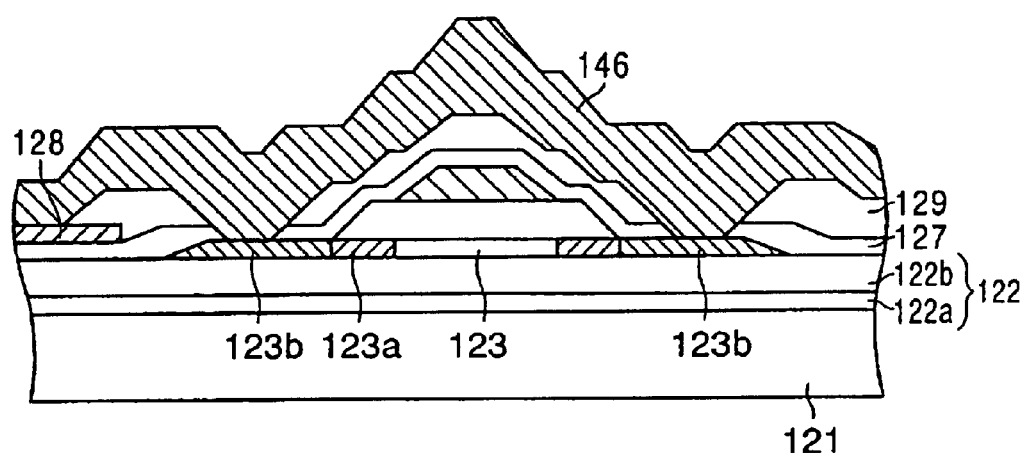

Then, as shown in FIG. 16, a conductive film 146 is formed by depositing Ti(100 nm)/Al(200 nm)/Ti(100 nm) onto the overall upper surface of the glass substrate 121 by virtue of the sputter method. This conductive film 146 is connected electrically to the high-concentration impurity diffusion regions 123b, 123d via the contact holes 129a.

In this case, the material of the conductive film 146 is not particularly limited. It is preferable that the laminated structure consisting of the Al or Al alloy, which has the good conductivity, and the refractory metal or its nitride, which has the good adhesiveness and corrosion resistance against the silicon, should be employed. As the refractory metal suitable for the conductive film 146, there are Mo (molybdenum), Ti (titanium), Cr (chromium), Ta (tantalum), W (tungsten), etc., for example.

Figure 17:
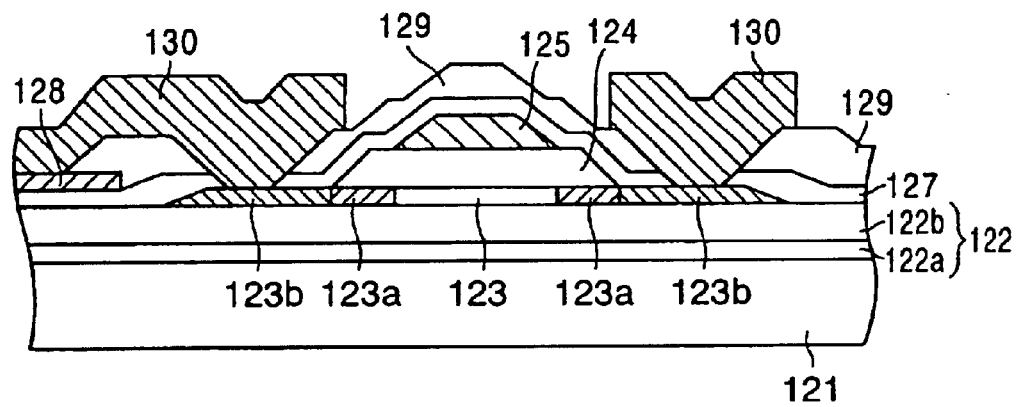

Then, as shown in FIG. 17, the data bus line 108 and the other wiring 130 are formed by patterning the conductive film 146 by the photolithography method. In the present embodiment, the source region of the TFT 105 is connected electrically to the pixel electrode 128 via the wiring 130, and the drain region of the TFT 105 is connected electrically to the data bus line 108 via other wiring 130.

The liquid crystal display panel is completed by arranging the TFT substrate, which is manufactured in this way, and the CF substrate, on which the color filters, the common electrode, etc. are formed, to oppose to each other and then sealing the liquid crystal between them.

In the present embodiment, as described above, the level difference is provided in the resist film 145 that covers the n-type TFT, and then the implantation of B (boron) into the polysilicon film 123 in the n-type TFT forming region at the time of forming the p-type TFT is prevented by using this resist film 145. Then, the resist film 145 is left only in the pixel-electrode forming region by applying the oxygen plasma process to the resist film 145, and then the pixel electrode 128 is formed by etching the ITO film 144 while using the remaining resist film 145 as a mask. Accordingly, the number of steps can be reduced in contrast to the method in the prior art. Also, in the present embodiment, the step of forming the contact holes is required only once and thus the number of manufacturing steps can be reduced much more. As a result, according to the present embodiment, the production cost of the liquid crystal display panel can be reduced considerably.

In this case, in the above embodiment, the case where the second insulating film is formed of SiN is explained. But the present invention is not limited to this case, and the second insulating film may be formed of polyimide or photosensitive resin. If the second insulating film is formed of the photosensitive resin, the film forming steps can be reduced further more and thus the number of manufacturing steps can be reduced more and more.

(Second Embodiment)

Figure 19:
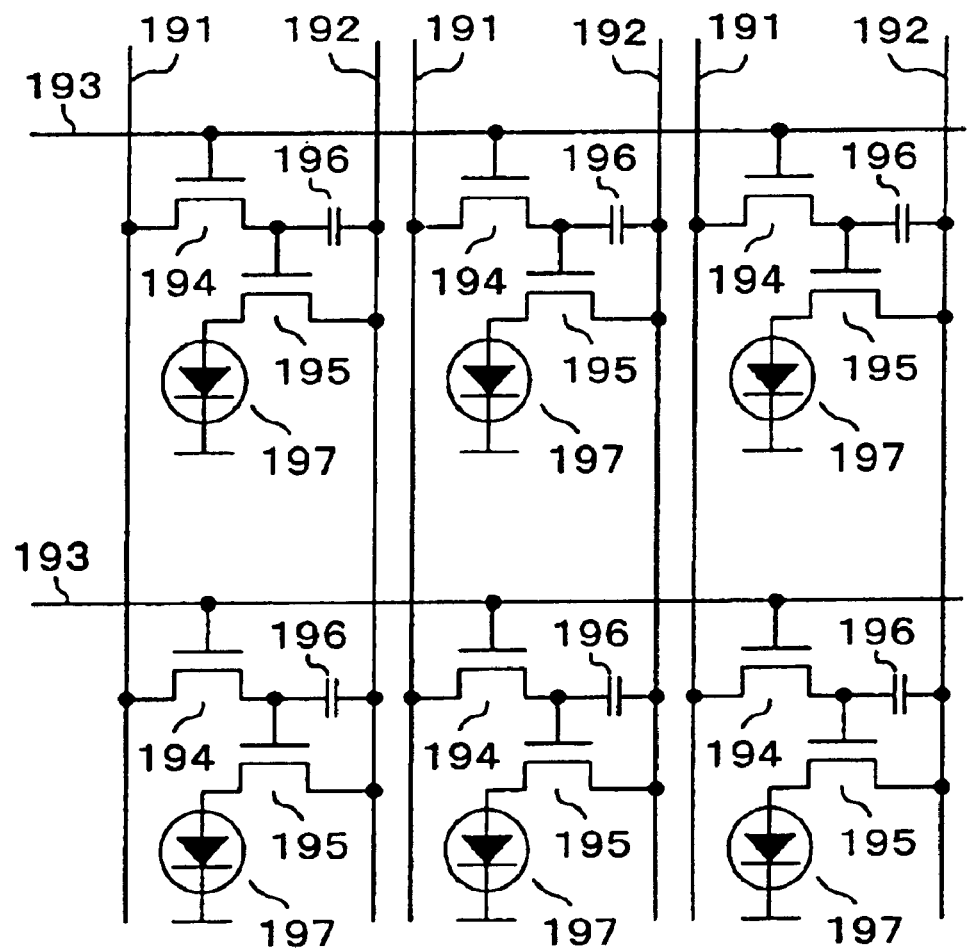
FIG. 19 is a circuit diagram showing a thin film transistor device (organic EL display panel) according to a second embodiment of the present invention.

FIG. 19 is a circuit diagram showing a thin film transistor device according to a second embodiment of the present invention. The present embodiment shows an example in which the present invention is applied to an organic EL display panel.

A plurality of data bus lines 191 and power supply lines 192, which extend in the vertical direction, and a plurality of scanning bus lines 193, which extend in the horizontal direction, are formed on the glass substrate. Areas that are partitioned by the data bus lines 191, the power supply lines 192, and the scanning bus lines 193 are the pixel area respectively.

A switching TFT 194, a driving TFT 195, a capacitor 196, and an organic EL element (light emitting element) 197 are provided to each pixel area respectively.

A gate of the switching TFT 194 is connected to the scanning bus line 193, a source of the switching TFT 194 is connected to a gate of the driving TFT 195, and a drain of the switching TFT 194 is connected to the data bus line 191. Also, the driving TFT 195 is connected between the power supply lines 192 and an anode of the organic EL element 197. Then, the capacitor 196 is connected between the gate of the driving TFT 195 and the power supply line 192.

In this organic EL display panel constructed in this manner, when a predetermined voltage is supplied to respective data bus lines 191 and also a scanning signal is supplied to the scanning bus line 193 only in the first row, the switching TFT 194 that is connected to the scanning bus line 193 in the first row is turned ON and then the voltage of the data bus line 191 is stored in the capacitor 196.

The current according to this voltage is supplied to the organic EL element 197 via the power supply lines 192 and the driving TFT 195, and then the organic EL elements 197 in the first row emit the light respectively. Then, when the predetermined voltage is supplied to respective data bus lines 191 and also the scanning signal is supplied to the scanning bus line 193 only in the second row, the organic EL elements 197 in the second row emit the light respectively.

In this manner, desired characters or images can be displayed by driving sequentially the organic EL elements 197 in respective rows.

Figure 20:
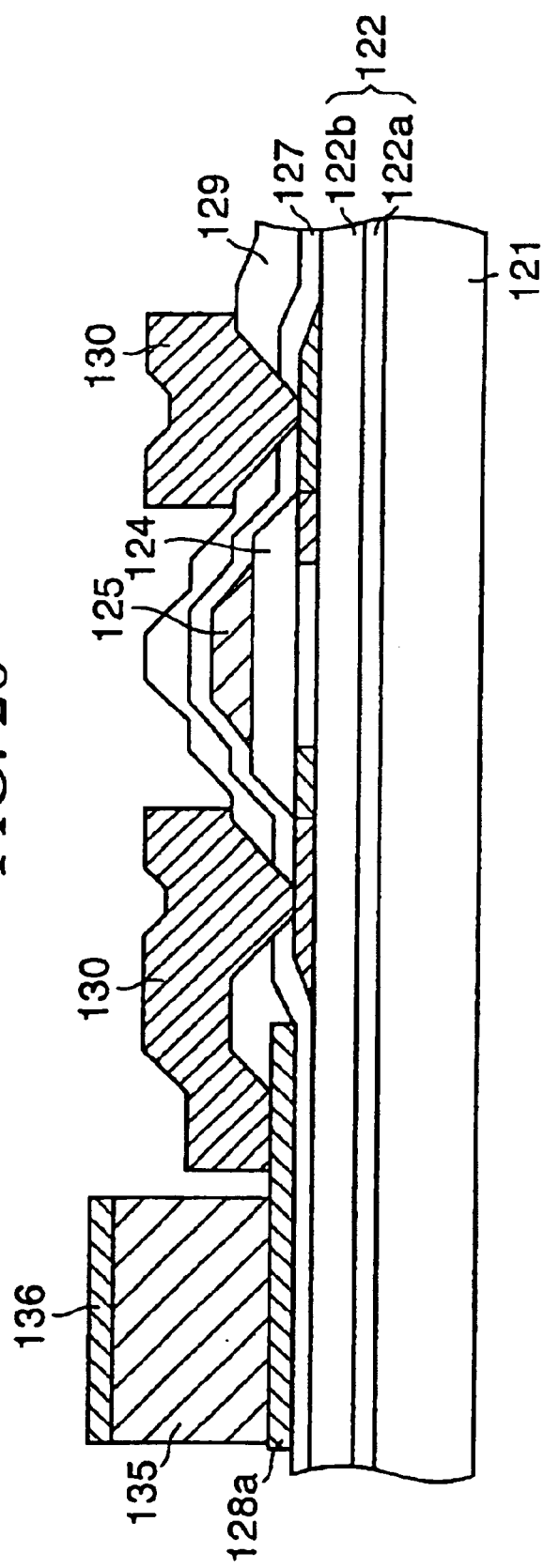
FIG. 20 is a sectional view showing a portion, in which a driving TFT and an organic EL element are formed, of the thin film transistor device according to the second embodiment of the present invention.

FIG. 20 is a sectional view showing the portion, in which the driving TFT 195 and the organic EL element 197 are formed. In FIG. 20, the same references are affixed to the same elements as those in FIG. 5, and their detailed explanation will be omitted herein.

In the present embodiment, an organic EL layer 135 is formed on an anode (display electrode) 128a made of ITO, and then a cathode 136 made of AlLi, or the like is formed on this organic EL layer 135. This cathode 136 is formed commonly to respective pixels.

When the driving TFT 195 is turned ON and the voltage is applied between the anode 128a and the cathode 136, the organic EL layer 135 emits the light. This light is transmitted through the anode 128a and the glass substrate 121 and then emitted to the outside.

In this case, in order to improve the luminous efficiency of the organic EL layer 135, any one or two or three of an electron transfer layer, a hole transfer layer, and a contact layer (layer for improving the contact property) may be arranged between the anode 128a and the cathode 136.

The TFTs of the organic EL display panel according to the present embodiment can be manufactured in the same manner as the first embodiment.

(Third Embodiment)

FIGS. 21A to 21M are sectional views showing a method of manufacturing a thin film transistor device (liquid crystal display panel) according to a third embodiment of the present invention in order of step. In these Figures, for convenience of explanation, the pixel TFT (n-type TFT) is illustrated on the left side and also the p-type TFT of the peripheral circuit is illustrated on the right side. Actually, the pixel TFTs are formed in the display region and the peripheral circuit is formed on the outside of the display region. Also, since the n-type TFTs of the peripheral circuit can be formed similarly to the pixel TFTs, illustration and explanation of them will be omitted herein.

First, as shown in FIG. 21A, a buffer layer 202 having a double-layered structure consisting of a SiN film 202a of 50 nm thickness and a $SiO_2$ film 202b of 200 nm thickness is formed on a glass substrate (transparent insulating substrate) 201 by depositing sequentially SiN and $SiO_2$ by virtue of the plasma CVD method. Then, an amorphous silicon film is formed on the $SiO_2$ film 202b by the plasma CVD method to have a thickness of about 40 nm. Then, a polysilicon film 203 is formed by crystallizing the amorphous silicon by using the excimer laser. Then, photoresist films 204 each having a predetermined shape are formed on the polysilicon film 203.

Then, as shown in FIG. 21B, the polysilicon film 203 is shaped into the same shape as the photoresist films 204 by etching the polysilicon film 203 while using the photoresist films 204 as a mask and using the fluoride system gas. Then, the photoresist films 204 are removed.

Then, as shown in FIG. 21C, a $SiO_2$ film 205 of about 100 nm thickness is formed as a gate insulating film on an overall upper surface of the glass substrate 201 by the CVD method. Then, an AlNd film 206 of about 300 nm thickness is formed as a gate electrode on the $SiO_2$ film 205 by the sputter method. Then, photoresist is coated on the AlNd film 206, and then resist films 207 each having a desired shape are formed by applying the exposing and developing processes to the photoresist.

Then, as shown in FIG. 21D, gate electrodes 209 is formed by wet-etching the AlNd film 206 while using the resist films 207 as a mask. At this time, a width of the gate electrode 209 is formed slightly narrowly rather than that of the resist film 207 by over-etching the AlNd film 206. Then, gate insulating films 208 each having the almost same width as the resist film 207 are formed by applying the dry-etching (anisotropic etching) to the $SiO_2$ film 205 while using the resist films 207 as a mask and using the fluoride system gas, for example. Then, the resist films 207 are removed.

In this manner, in the present embodiment, the terrace structure consisting of the gate insulating film 208 and the gate electrode 209 whose width is narrower than the gate insulating film 208 can be formed by one masking step.

Then, as shown in FIG. 21E, source/drain regions of the n-type TFT are formed by ion-implanting p (phosphorus) into the polysilicon film 203. For example, high-concentration impurity diffusion regions 203b are formed by ion-implanting P into the polysilicon film 203 at an acceleration energy of 10 keV and a dosage of $1.0 \times 10^{15}$ cm$^{-2}$ while using the gate insulating film 208 and the gate electrode 209 as a mask. Also, LDD regions 203a of the n-type TFT are formed by ion-implanting P into the polysilicon film 203 at an acceleration energy of 70 keV and a dosage of $5.0 \times 10^{13}$ cm$^{-2}$ while using the gate electrode 209 as a mask.

Then, as shown in FIG. 21F, source/drain regions of the p-type TFT are formed by ion-implanting B (boron) into the polysilicon film 203 in the p-type TFT forming region while covering only the n-type TFT forming region with a resist film 210. For example, high-concentration impurity diffusion regions 203d are formed by ion-implanting B into the polysilicon film 203 at an acceleration energy of 10 keV and a dosage of $2.0 \times 10^{15}$ cm$^{-2}$ while using the gate insulating film 208 and the gate electrode 209 as a mask. Also, LDD regions 203c of the p-type TFT are formed by ion-implanting B into the polysilicon film 203 at an acceleration energy of 70 keV and a dosage of $2.0 \times 10^{14}$ cm$^{-2}$ while using the gate electrode 209 as a mask. In this manner, the n-type TFT can be changed into the p-type TFT by implanting the p-type impurity into the polysilicon film 203, into which the n-type impurity has been introduced, in larger quantity than the n-type impurity. Then, the resist film 210 is removed by the ashing.

Then, as shown in FIG. 21G, the impurity that has been introduced into the polysilicon film 203 is activated by irradiating the excimer laser onto the polysilicon film 203.

Then, as shown in FIG. 21H, a $SiO_2$ film 211 of 60 nm thickness and a SiN film 212 of 370 nm thickness are formed sequentially as an interlayer insulating film on an overall upper surface of the glass substrate 201 by the plasma CVD method. Also, an ITO film 213 of about 70 nm thickness is formed on the SiN film 212. Then, a resist film 214 having a predetermined pattern is formed on the ITO film 213.

Then, as shown in FIG. 21I, contact holes 212a reaching the high-concentration impurity diffusion regions 203b, 203d of the n-type TFT and the p-type TFT are formed by wet-etching the ITO film 213 while using the resist film 214 as a mask and then dry-etching the interlayer insulating film (the SiN film 212 and the $SiO_2$ film 211) while using the fluoride system gas. Then, the resist film 214 is removed.

Then, as shown in FIG. 21J, a conductive film 215 is formed on the overall upper surface of the glass substrate 201. This conductive film 215 is formed to have a structure in which a Mo film (50 nm), an Al film (200 nm), a MON film (90 nm), and a Mo film (15 nm), for example, are laminated from the bottom.

Then, as shown in FIG. 21K, a resist film 216 is formed on the conductive film 215 such that a thickness of such resist film is thick in the wiring forming region and thin in the pixel-electrode forming region. Then, the data bus lines and other wirings 220a are formed by etching the conductive film 215 while using the resist film 216 as a mask. Then, the pixel electrode 218 is formed by etching the ITO film 213 while using the resist film 216 as a mask. In this case, the conductive film 215 still remains on the pixel electrode 218 at this time.

As explained in the first embodiment, the resist film 216 is formed by employing the half-exposure, in which two sheets of exposure masks are used, or the exposure mask, in which a number of opening portions whose diameter is smaller than the critical value of the resolution are provided, for example.

Then, as shown in FIG. 21L, the resist film 216 is removed (ashing) until the conductive film 215 in the pixel-electrode forming region is exposed.

Figure 21M:
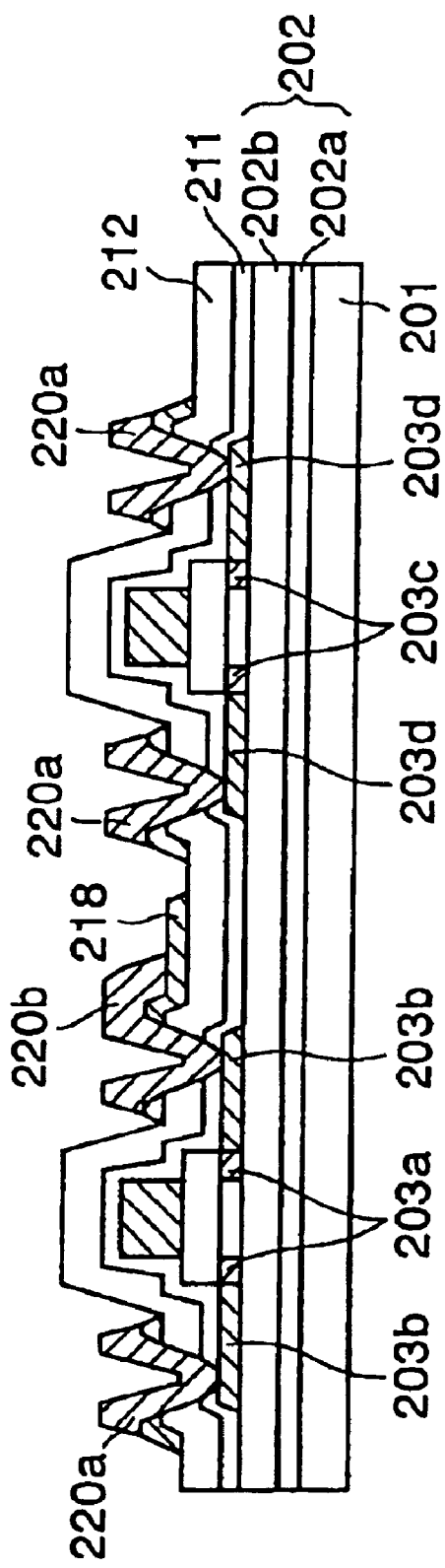

Then, the conductive film 215 on the pixel-electrode forming region is removed by executing the etching while using the resist film 216 as a mask. Thus, as shown in FIG. 21M, the pixel electrode 218 is exposed. Also, the wirings 220b for connecting the source region of the pixel TFT and the pixel electrode 218 are formed. Then, the resist film 216 is removed. In this manner, the TFT substrate of the liquid crystal display panel is completed.

In the present embodiment, since the wirings 220a, 220b and the pixel electrode 218 can be formed by one making step, the number of masking steps can be reduced rather than the conventional method. As a result, the production cost of the liquid crystal display panel can be reduced considerably rather than the prior art.

(Fourth Embodiment)

FIGS. 22A to 22E are sectional views showing a method of manufacturing a thin film transistor device (liquid crystal display panel) according to a fourth embodiment of the present invention in order of step.

First, as shown in FIG. 22A, like the third embodiment, the insulating film 202 consisting of the SiN film 202a and the SiO$_2$ film 202b, the polysilicon films 203, the gate insulating films 208, and the gate electrodes 209 are formed on the glass substrate 201. The n-type LDD regions 203a and the high-concentration impurity diffusion regions 203b are formed by introducing P (phosphorus) in the polysilicon film 203 in the n-type TFT forming region. Also, the p-type LDD regions 203c and the high-concentration impurity diffusion regions 203d are formed by introducing B (boron) in the polysilicon film 203 in the p-type TFT forming region.

Then, as shown in FIG. 22B, the SiO$_2$ film 211 of 60 nm thickness and the SiN film 212 of 370 nm thickness are formed sequentially as the interlayer insulating film on an overall upper surface of the glass substrate 201 by the plasma CVD method. Then, the ITO film 213 of 70 nm thickness is formed as the transparent conductive film on the interlayer insulating film by the sputter method, for example. Then, a resist film 221 in which contact-hole forming portions are opened and whose thickness is thick in the pixel-electrode forming region and is thin in other regions is formed on the ITO film 213. As explained in the first embodiment, such resist film 221 is formed by the method employing two sheets of exposure masks, or the method employing the exposure mask in which a number of opening portions whose diameter is smaller than the critical value of the resolution are provided.

Then, as shown in FIG. 22C, contact holes 212b are formed by wet-etching the ITO film 213 while using the resist film 221 as a mask and then dry-etching the SiN film 212 and the SiO$_2$ film 211 while using the fluoride system gas.

Then, as shown in FIG. 22D, the ashing is applied to the resist film 221. Thus, the resist film 221 is left only on the pixel-electrode forming region, and also the resist film 221 in other portions is removed. Then, a pixel electrode 228 is formed by wet-etching the ITO film 213 while using the remaining resist film 221 as a mask. Then, the resist film 221 on the pixel electrode 228 is removed.

Figure 22E:
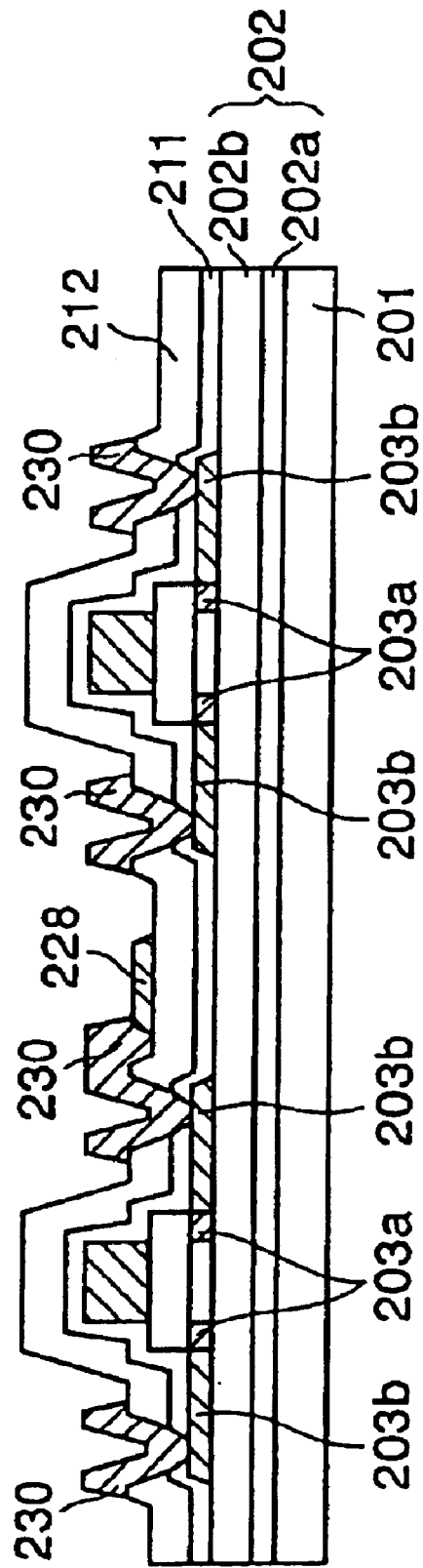

Then, a conductive film having a laminated structure consisting of Ti film (100 nm)/Al film (200 nm)/Ti film (100 nm) is formed on the overall upper surface of the glass substrate 201 by the sputter method, and then the resist film (not shown) having a predetermined pattern is formed thereon. Then, as shown in FIG. 22E, the data bus lines and other wirings 230 are formed by etching the conductive film by means of the dry etching using the Cl (chlorine) system gas while using the resist film as a mask. The source region of the pixel TFT is connected electrically to the pixel electrode 228 via the wiring 230. Also, the drain region of the pixel TFT is connected electrically to the data bus line via other wiring 230.

The TFT substrate, which is formed in this manner, and the CF substrate are arranged to oppose to each other, and then the liquid crystal is sealed between them. Accordingly, the liquid crystal display panel is completed.

In the present embodiment, like the third embodiment, the number of masking steps can be reduced rather than the conventional method. Therefore, there can be achieved such advantage that the productivity can be improved and also the production cost can be reduced.

In the above third embodiment, there is such a possibility that, when the contact holes 212a are formed by etching the ITO film 213 and the interlayer insulating film (the SiN film 212 and the SiO$_2$ film 211) (see FIG. 21I), the interlayer insulating film that is formed under the edge of the ITO film 213 serving as the pixel electrode is over-etched and thus the conduction failure is caused in the contact holes 212a upon forming the wiring. In contrast, in the present embodiment, after the contact holes 212b are formed, the pixel electrode 228 is formed by etching the ITO film 213 and then the wiring 230 is formed. Therefore, there can be achieved the advantage such that generation of the conduction failure between the pixel electrode 228 and the source of the TFT can be avoided.

(Fifth Embodiment)

FIGS. 23A to 23I are sectional views showing a method of manufacturing a thin film transistor device (liquid crystal display panel) according to a fifth embodiment of the present invention in order of step.

Figure 23A:
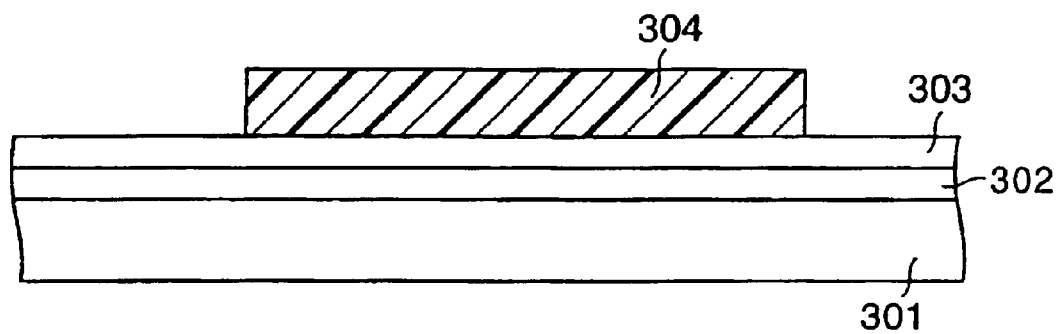
FIGS. 23A to 23I are sectional views showing a method of manufacturing a thin film transistor device (liquid crystal display panel) according to a fifth embodiment of the present invention in order of step.

First, as shown in FIG. 23A, a buffer layer 302 having a double-layered structure consisting of a SiN film of 50 nm thickness and a SiO$_2$ film of 100 nm thickness is formed by depositing sequentially SiN and SiO$_2$ on a glass substrate (transparent insulating substrate) 301 by the plasma CVD method. Then, an amorphous silicon film of about 40 nm thickness is formed on the buffer layer 302 by the plasma CVD method using the material gas which is prepared by added H$_2$ into SiH$_4$. Then, the silicon is crystallized by irradiating the excimer laser beam of an energy intensity of 300 mJ/cm$^2$, for example, to form a polysilicon film 303. Then, the photoresist is coated on the polysilicon film 303, and then a resist film 304 is formed in the TFT forming region of the polysilicon film 303 by applying the exposing and developing processes to the photoresist.

Figure 23B:
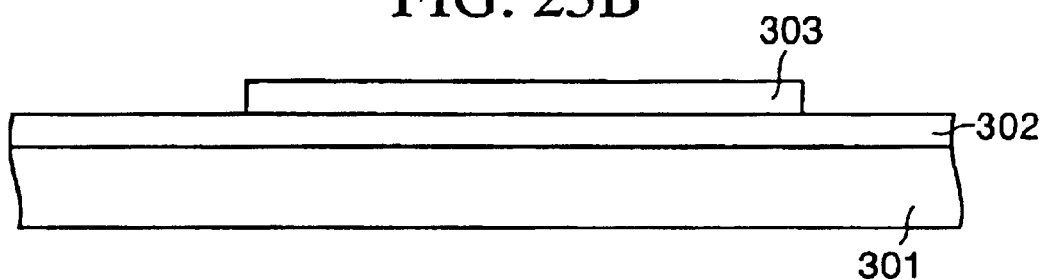

Then, as shown in FIG. 23B, the polysilicon film 303 is shaped into the shape of the resist film 304 by dry-etching the polysilicon film 303 while using the resist film 304 as a mask. Then, the resist film 304 is removed.

Figure 23C:
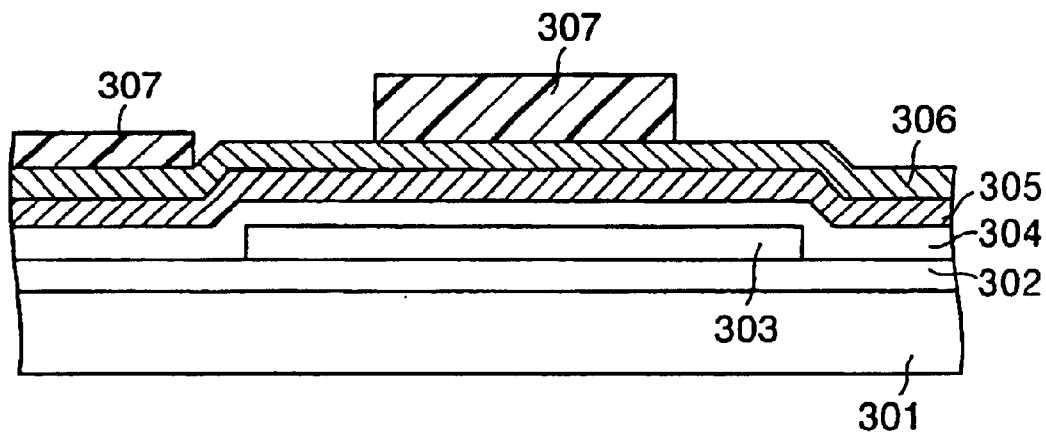

Then, as shown in FIG. 23C, a SiO$_2$ film 304 is formed as a gate insulating film on an overall upper surface of the glass substrate 301. Then, an ITO film 305 of 50 to 100 nm thickness is formed on the SiO$_2$ film 304 by the sputter method. As the conditions in forming the ITO film, for example, the Ar gas and the O$_2$ gas are supplied to the chamber at a flow rate of 250 sccm (standard cc/min) and a flow rate of 0.4 sccm respectively, the pressure in the chamber is set to 0.8 Pa, the DC power is set to 1 W/cm$^2$, and the substrate temperature is set to 30° C.

Then, a metal film 306 having a double-layered structure which is formed by laminating a Mo film of 50 nm thickness and an AlNd film of 350 nm thickness in this order is formed on the ITO film 305. Then, the photoresist is coated on the metal film 306, and then resist films 307 for covering the gate electrode, other wiring forming region, and the pixel-electrode forming region is formed by applying the exposing and developing processes to the photoresist. At this time, since the method employing two sheets of exposure masks or the method employing the exposure mask in which a number of opening portions whose diameter is smaller than the critical value of the resolution are provided is used, a thickness of the resist film 307 in the wiring forming region is set to about 1 μm and also a thickness of the resist film 307 in the pixel-electrode forming region is set to about 0.5 μm.

Figure 23D:
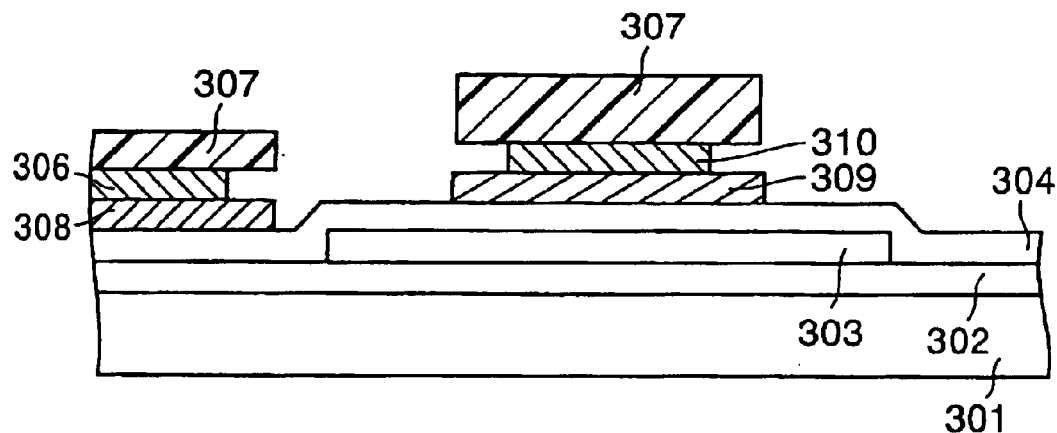

Then, as shown in FIG. 23D, the metal film 306 is wet-etched by the etchant containing the phosphoric acid as the major component while using the resist film 307 as a mask, and also the ITO film 305 is etched by the dry etching (anisotropic etching). Thus, a pixel electrode 308 made of the ITO film, a first gate electrode film 309 made of the ITO film, and a second gate electrode film 310 made of the metal film are formed. A gate electrode of the TFT is constructed by the first gate electrode film 309 and the second gate electrode film 310.

At this time, a width of the second gate electrode film 310 is formed slightly narrowly rather than a width of the resist film 307 by over-etching the metal film 306. Since the first gate electrode film 309 is formed by the dry etching (anisotropic etching), such film is formed to have the almost same width as the resist film 307. In this case, the metal film 306 is left on the pixel electrode 308 in this etching step.

In this case, in the present embodiment, as described later, the LDD regions are formed by utilizing the difference in width between the first gate electrode film 309 and the second gate electrode film 310. In this case, if an interval between the edge of the first gate electrode film 309 and the edge of the second gate electrode film 310 in the horizontal direction is smaller than 0.3 μm, the effect of forming the LDD regions is reduced. In contrast, if the interval is larger than 2 μm, the miniaturization of the TFT cannot be attained. As a result, it is preferable that the interval between the edge of the first gate electrode film 309 and the edge of the second gate electrode film 310 in the horizontal direction should be set to 0.3 to 2 μm.

Figure 23E:
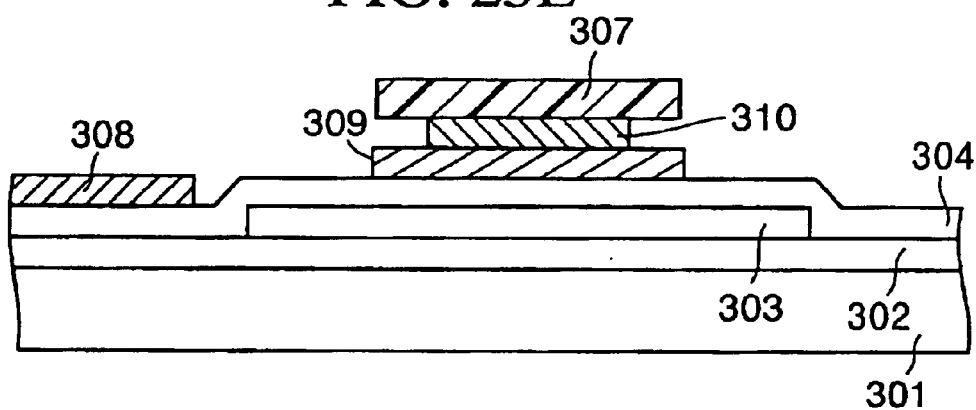

Then, as shown in FIG. 23E, the oxygen plasma process (ashing) is applied to the resist film 307. Thus, the resist film 307 on the pixel electrode 308 is removed and also the resist film 307 is left only on the second gate electrode film 310. Then, the metal film 306 on the pixel electrode 308 is removed by the etching. Then, the resist film 307 on the second gate electrode film 310 is removed.

Figure 23F:
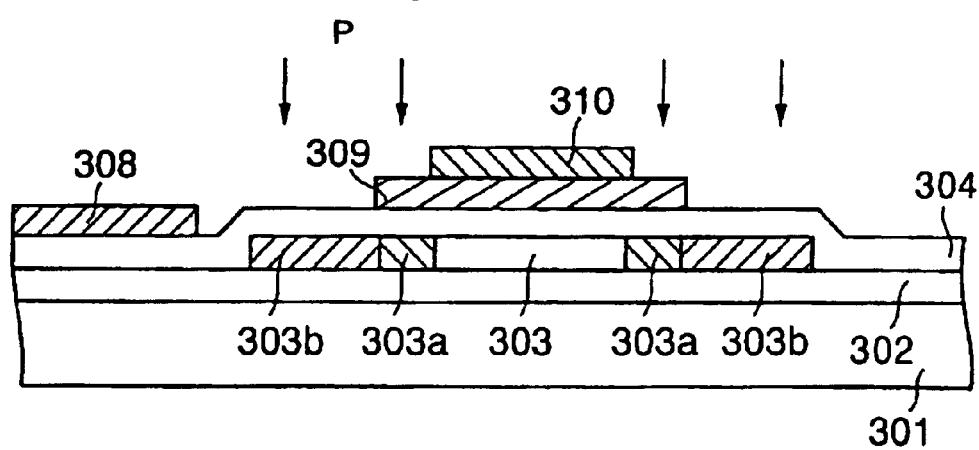

Then, as shown in FIG. 23F, the source/drain regions of the n-type TFT are formed by introducing the n-type impurity into the polysilicon film 303. In other words, high-concentration impurity diffusion regions 303b are formed by ion-implanting P (phosphorus) into the polysilicon film 303 at a low acceleration energy with high concentration while using the first gate electrode film 309 and the second gate electrode film 310 as a mask. Also, LDD regions 303a are formed by ion-implanting P into the polysilicon film 303 at a high acceleration energy with low concentration while using the second gate electrode film 310 as a mask.

In the case of the p-type TFT, like the first embodiment, the n-type TFT is covered with the resist film, and then B (boron) is implanted at the concentration that is twice or more that of P (phosphorus), which has already been introduced into the polysilicon film 303 in the p-type TFT forming region.

Figure 23G:
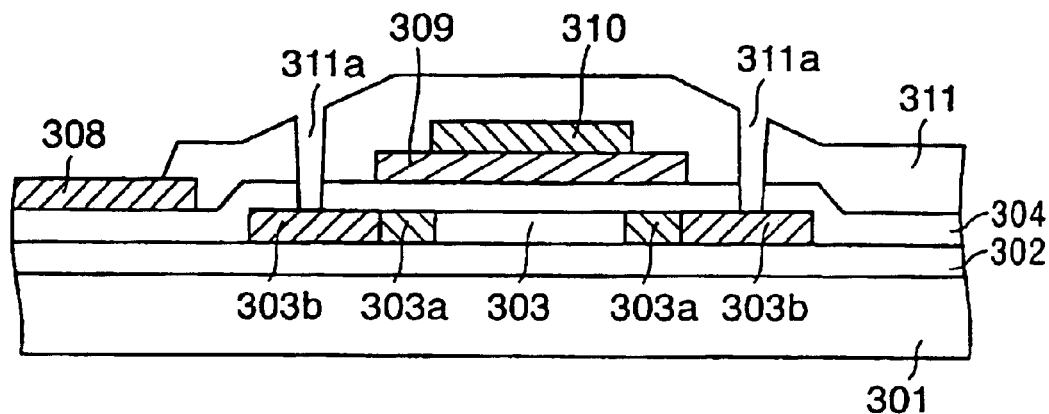

Then, as shown in FIG. 23G, an interlayer insulating film 311 having a double-layered structure consisting of a $SiO_2$ film of 60 nm thickness and a SiN film of 370 nm thickness is formed on the overall upper surface of the glass substrate 301. Then, according to the photolithography method, the interlayer insulating film 311 on the pixel electrode 308 is removed and also contact holes 311a reaching the high-concentration impurity diffusion region 303b of the TFT respectively are formed. The etching of the interlayer insulating film 311 and the gate insulating film 304 is carried out by the dry etching using the $CF_4/O_2$ system gas, for example.

Figure 23H:
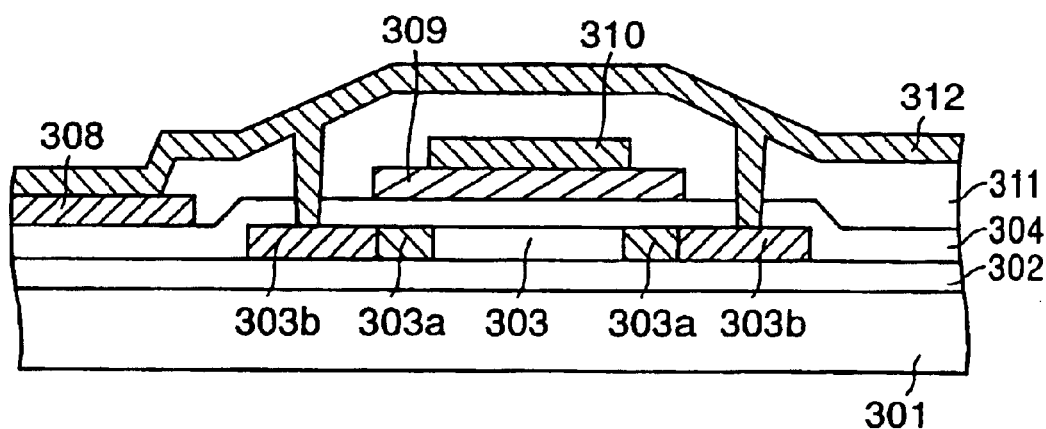

Then, as shown in FIG. 23H, a metal film 312 made of metal such as Mo is formed on the overall upper surface of the glass substrate 301 to have a thickness of about 400 nm. This metal film 312 is connected electrically to the high-concentration impurity diffusion regions 303b via the contact holes 311a.

If the wiring resistance is regarded as important, the metal film 312 may be constructed by the laminated structure consisting of Al and the refractory metal. For example, the Mo/Al/Mo laminated structure may be employed.

Figure 23I:
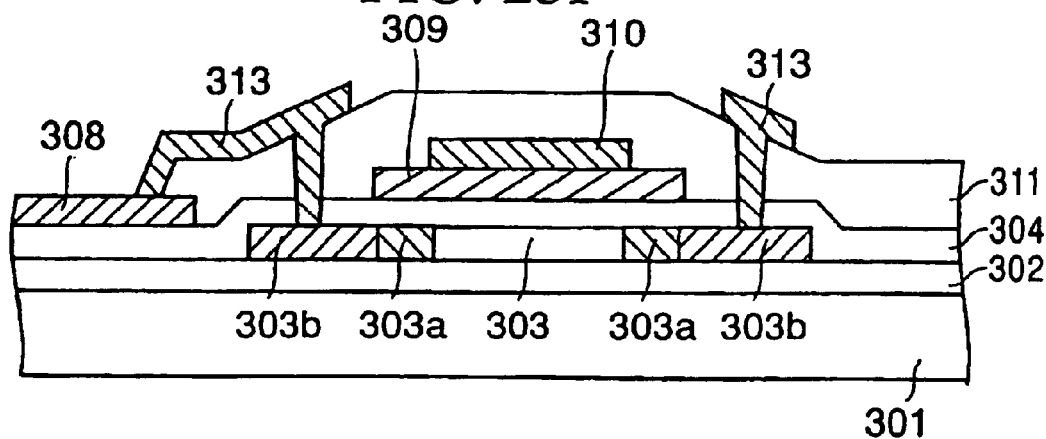

Then, as shown in FIG. 23I, wirings 313 are formed by patterning the metal film 312 by using the photolithography method. The source region of the pixel TFT is connected electrically to the pixel electrode 308 via the wiring 313, and also the drain region of the pixel TFT is connected electrically to the data bus line via other wiring 313.

The liquid crystal display panel is completed by arranging the TFT substrate, which is formed in this manner, and the CF substrate, on which the color filters, the common electrode, etc. are formed, to oppose mutually and then sealing the liquid crystal between them.

Also, in the present embodiment, since the pixel electrode 308, the first gate electrode film 309, and the second gate electrode film 310 are formed by one masking step, the number of manufacturing steps can be reduced in contrast to the method in the prior art. Also, in the present embodiment, as described above, the gate electrode is formed as the double-layered structure consisting of the first gate electrode film 309 and the second gate electrode film 310, and then the LDD regions 303a are formed by utilizing the difference in width between the first gate electrode film 309 and the second gate electrode film 310. Accordingly, there is no necessity to pattern the gate insulating film 304 and thus the damage of the polysilicon film 303 by the patterning of the gate insulating film 304 can be avoided. As a result, such an advantage can be achieved that the TFT having the good characteristic can be obtained.

In this case, in the above embodiments, the case where the n-type TFT and the p-type TFT are formed on the substrate is explained. But the present invention can be applied to the case where only one of the n-type TFT and the p-type TFT is formed on the substrate.

Also, the present invention is not limited to the above liquid crystal display panel and the organic EL display panel and their manufacturing methods. The present invention can be applied to other electronic devices having the TFT and their manufacturing methods.

What is claimed is:

1. A thin film transistor device manufacturing method comprising the steps of:

forming a semiconductor film in a thin film transistor forming region on a substrate;

forming a gate insulating film and a gate electrode on the semiconductor film;

forming an interlayer insulating film on an overall upper surface of the substrate;

forming a first conductive film as a display electrode on the interlayer insulating film;

forming a resist film, in which contact hole forming regions are opened, on the first conductive film;

forming contact holes, which reach the semiconductor film from a surface of the first conductive film, by executing an etching while using the resist film as a mask;

removing the resist film to leave only on the display electrode forming region;

etching the first conductive film while using the resist film remaining on the display electrode forming region as a mask;

removing the resist film on the display electrode forming region;

forming a second conductive film on the overall upper surface of the substrate; and processing the second conductive film into a predetermined shape.

2. A thin film transistor device manufacturing method according to claim 1, wherein the first conductive film is formed of transparent conductor.

3. A thin film transistor device manufacturing method according to claim 1, wherein the resist film is formed thick in the display electrode forming region and thin in other regions.

4. A thin film transistor device manufacturing method according to claim 1, wherein the gate electrode is formed to have a width that is narrower than the gate insulating film, and high-concentration impurity diffusion regions and LDD regions are formed by implanting plural times an impurity into the semiconductor film at different acceleration energies.

* * * * *

UNITED STATES PATENT AND TRADEMARK OFFICE
CERTIFICATE OF CORRECTION

PATENT NO. : 6,939,750 B2
DATED : September 6, 2005
INVENTOR(S) : Kazushige Hotta et al.

It is certified that error appears in the above-identified patent and that said Letters Patent is hereby corrected as shown below:

Title page,
Item [73], Assignee, delete "Fujitsu Display Technologies Corporation, Kawasaki (JP)" and insert -- Sharp Kabushiki Kaisha, Osaka (JP) --.

Signed and Sealed this

Seventh Day of February, 2006

JON W. DUDAS
*Director of the United States Patent and Trademark Office*